(12) United States Patent
Kobayashi et al.

(10) Patent No.: US 10,789,724 B2
(45) Date of Patent: Sep. 29, 2020

(54) IMAGING APPARATUS, IMAGING SYSTEM, MOVING BODY, AND SEMICONDUCTOR SUBSTRATE FOR LAMINATION

(71) Applicant: CANON KABUSHIKI KAISHA, Tokyo (JP)

(72) Inventors: Hideo Kobayashi, Tokyo (JP); Takahiro Shirai, Isehara (JP); Daisuke Yoshida, Ebina (JP); So Hasegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/433,968

(22) Filed: Jun. 6, 2019

(65) Prior Publication Data

US 2019/0378288 A1  Dec. 12, 2019

(30) Foreign Application Priority Data

Jun. 8, 2018 (JP) .................. 2018-110421

(51) Int. Cl.
| | | |
|---|---|---|
| H04N 5/369 | (2011.01) | |
| G06T 7/55 | (2017.01) | |
| H04N 5/374 | (2011.01) | |
| H04N 5/378 | (2011.01) | |
| H01L 27/146 | (2006.01) | |

(52) U.S. Cl.
CPC ............. *G06T 7/55* (2017.01); *H04N 5/3692* (2013.01); *H04N 5/378* (2013.01); *H04N 5/3741* (2013.01); *G06T 2207/30252* (2013.01); *H01L 27/14627* (2013.01); *H01L 27/14643* (2013.01)

(58) Field of Classification Search
CPC .................................................... H04N 5/3692
USPC ........................................................ 348/294
See application file for complete search history.

(56) References Cited

U.S. PATENT DOCUMENTS

| | | |
|---|---|---|
| 2009/0040350 A1 | 2/2009 | Yamauchi |
| 2009/0310001 A1 | 12/2009 | Masuyama |
| 2012/0307120 A1 | 12/2012 | Ito |
| 2015/0271426 A1* | 9/2015 | Ito .......................... H04N 5/341 |
| | | 348/308 |
| 2017/0280086 A1 | 9/2017 | Chao |

FOREIGN PATENT DOCUMENTS

| | | |
|---|---|---|
| JP | 2013-055589 A | 3/2013 |
| JP | 2014-146849 A | 8/2014 |
| JP | 2016-12903 A | 1/2016 |
| JP | 2018-078370 A | 5/2018 |
| RU | 2522991 C2 | 7/2014 |
| RU | 2580422 C2 | 4/2016 |
| RU | 2589489 C2 | 7/2016 |
| WO | 2014-132822 A1 | 9/2014 |

* cited by examiner

*Primary Examiner* — Joel W Fosselman

(74) *Attorney, Agent, or Firm* — Canon U.S.A., Inc. IP Division

(57) ABSTRACT

An imaging apparatus includes a plurality of pixels, a plurality of signal lines, and a plurality of comparators. The imaging apparatus further includes a first switch and a second switch. The first switch includes a first terminal configured to receive signal from one of the signal lines is input, and a second terminal connected to an input node of one of the comparators. The second switch includes a first terminal connected to the input node of the one comparator, and a second terminal to which a signal from another one of the signal lines is input.

27 Claims, 14 Drawing Sheets

FIG.8A FIG.8B
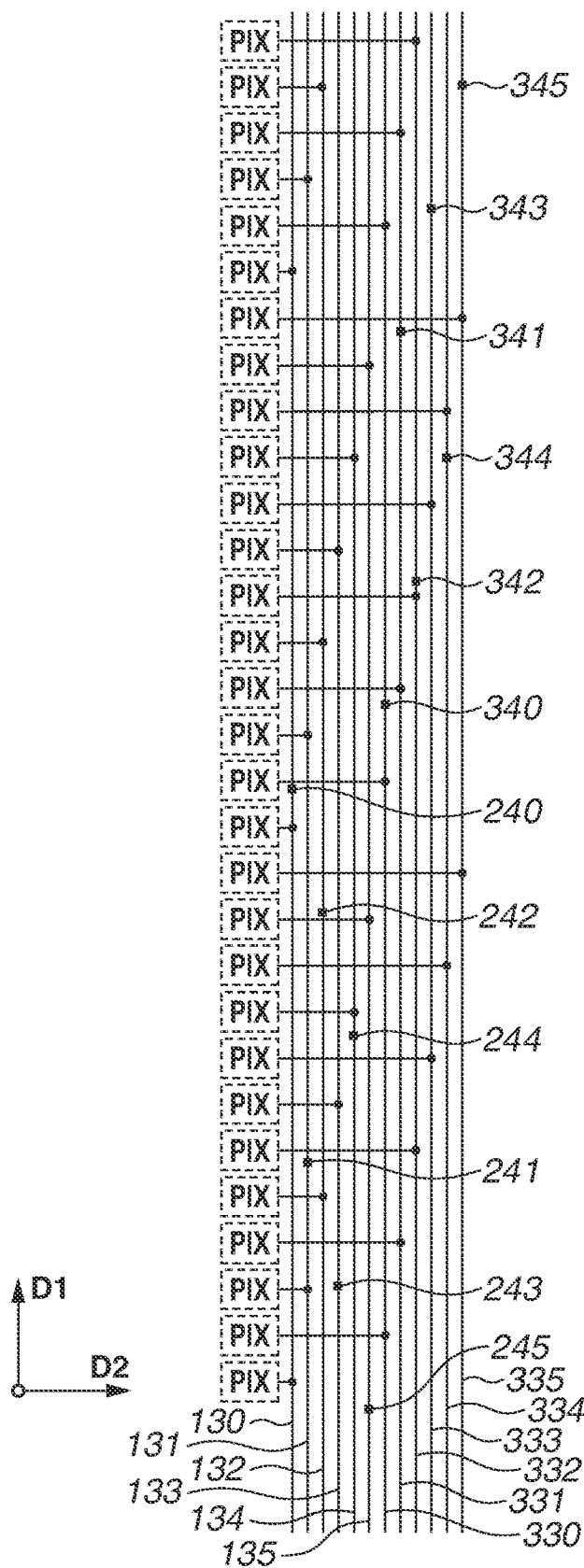
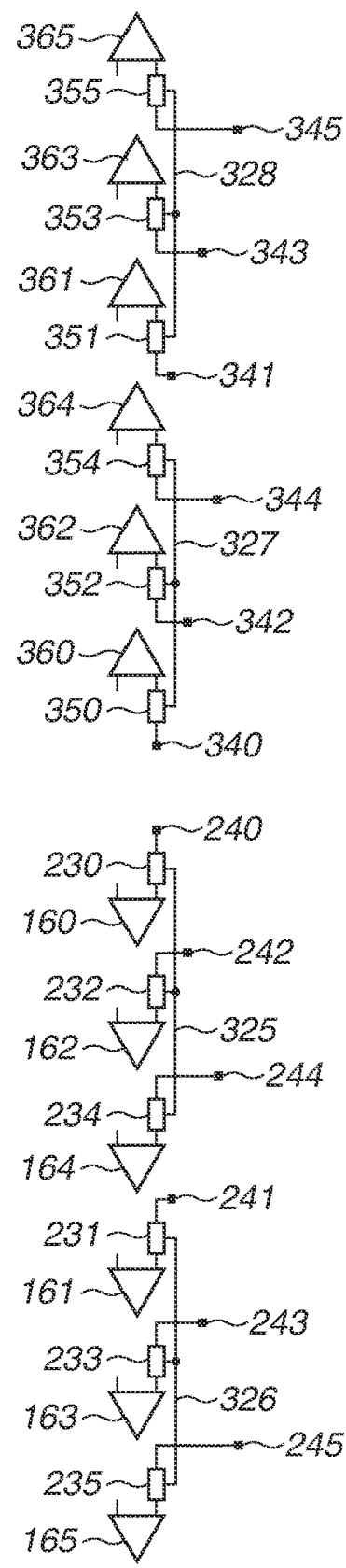

FIG.12B
FRONT VIEW
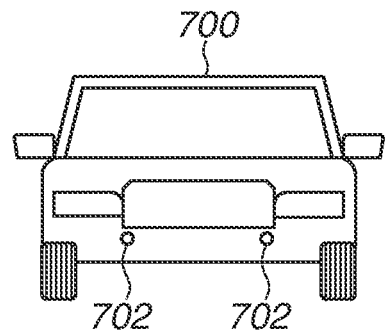
TOP VIEW
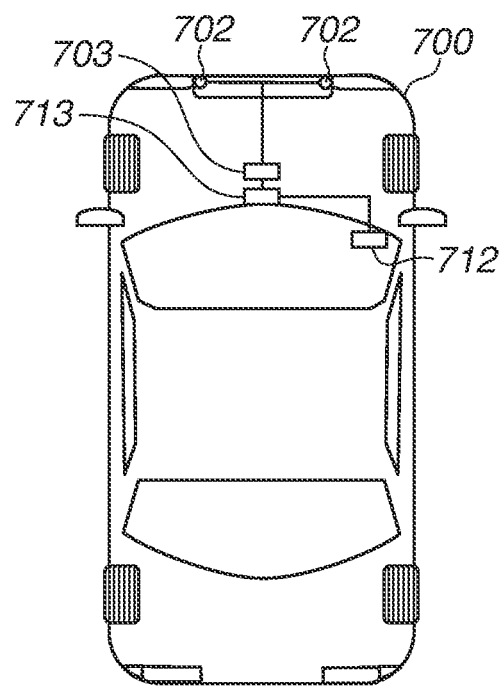
REAR VIEW
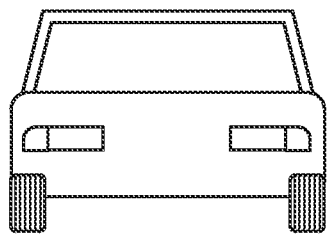

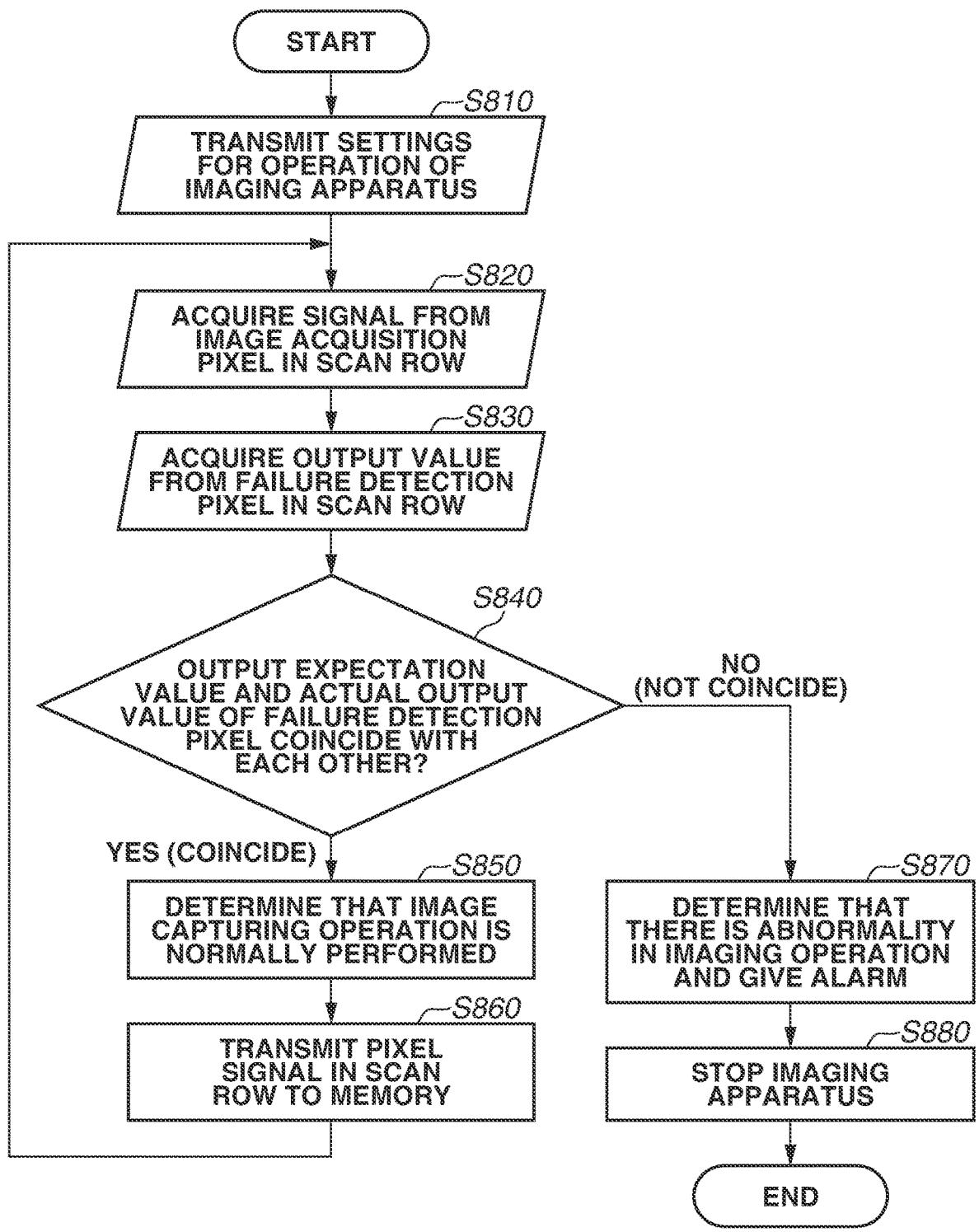

IMAGING APPARATUS, IMAGING SYSTEM, MOVING BODY, AND SEMICONDUCTOR SUBSTRATE FOR LAMINATION

BACKGROUND OF THE INVENTION

Field of the Invention

The present invention relates to an imaging apparatus, an imaging system, a moving body, and a semiconductor substrate for lamination.

Description of the Related Art

International Publication No. WO2014-132822 discusses a solid-state imaging apparatus in which a switch is provided between a plurality of vertical signal lines for reading signals from pixels. In the configuration discussed in International Publication No. WO2014-132822, a signal from a certain vertical signal line can be read from a reading circuit corresponding to another vertical signal line by turning on a switch between the vertical signal lines. In the configuration of International Publication No. WO2014-132822, however, the signal is read in the state where the two vertical signal lines are connected together. Thus, the capacitance of the reading path increases and, in consequence, there is a possibility that when the signal is read, the operation speed decreases.

SUMMARY OF THE INVENTION

According to an aspect of the present invention, an imaging apparatus includes a plurality of pixels including a first pixel and a second pixel, a plurality of signal lines including a first signal line connected to the first pixel and a second signal line connected to the second pixel, a plurality of comparators including a first comparator and a second comparator, the first comparator being configured to receive signal from the first signal line, the second comparator being configured to receive signal from the first signal line and the second signal line, a first switch including a first terminal and a second terminal, wherein the first terminal of the first switch is connected to the second signal line and configured to receive the signal from the second signal line, and the second terminal of the first switch is connected to an input node of the second comparator, and the second switch including a first terminal and a second terminal, wherein the second terminal of the second switch is connected to the first signal line and configured to receive the signal from the first signal line as an input, and the first terminal of the second switch is connected to the input node of the second comparator.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

BRIEF DESCRIPTION OF THE DRAWINGS

FIG. 8A is a schematic diagram of the imaging apparatus according to the fourth exemplary embodiment. FIG. 8B is a schematic diagram of the imaging apparatus according to the fourth exemplary embodiment.

FIG. 12B is a diagram illustrating the configuration of the moving body according to the seventh exemplary embodiment.

FIG. 13 is a diagram illustrating an operation processing procedure of the moving body according to the seventh exemplary embodiment.

DESCRIPTION OF THE EMBODIMENTS

With reference to the drawings, exemplary embodiments will be described below. According to the exemplary embodiments, the description of components similar to those in other exemplary embodiments is occasionally omitted for the sake of brevity. According to the exemplary embodiments, unless otherwise noted, a switch is, for example, an N-type metal-oxide-semiconductor (MOS) transistor. The switch being in an on state refers to the state where a control pulse at a high level is input to the N-type MOS transistor, and the N-type MOS transistor is in a conduction state. The switch being in an off state refers to the state where a control pulse at a low level is input to the N-type MOS transistor, and the N-type MOS transistor is in a non-conduction state. Alternatively, a P-type MOS transistor may be used as the switch instead of the N-type MOS transistor. When using a P-type MOS transistor, the voltage supplied to the P-type MOS transistor (e.g. the voltage of the control pulse) is reserved in comparison to the voltage supplied to an N-type MOS transistor. Yet alternatively, the switch may be a complementary metal-oxide-semiconductor (CMOS) switch using both an N-type MOS transistor and a P-type MOS transistor—in this case, an appropriate change to the characteristics of the supply voltage can be made.

Further, according to the exemplary embodiments, the connection relationship between circuit elements is described, but can be appropriately changed by inserting another element (e.g. a switch or a buffer) between the circuit elements.

Figure 1:
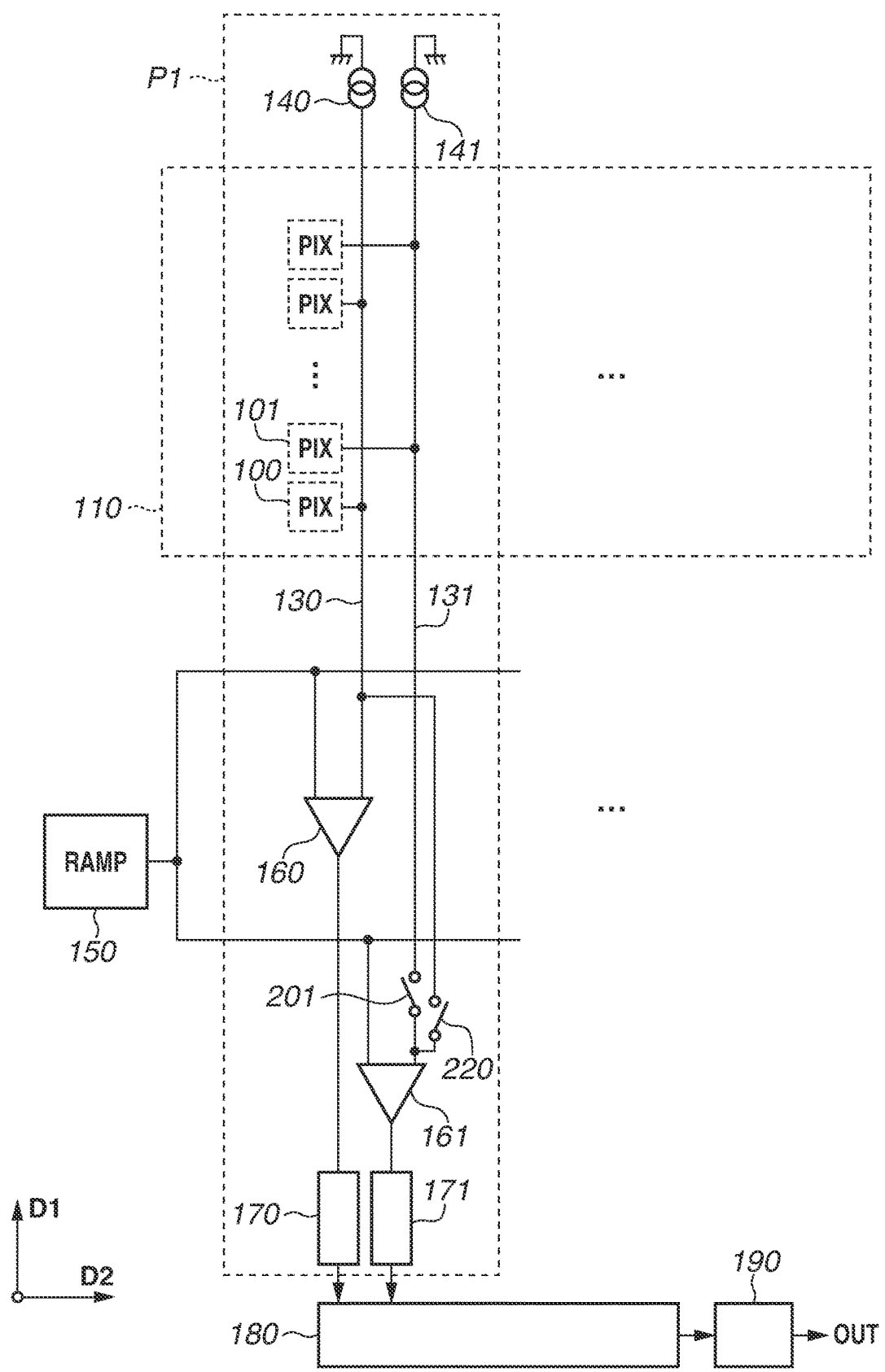
FIG. 1 is a schematic diagram of an imaging apparatus according to a first exemplary embodiment.

FIG. 1 is a schematic diagram of an imaging apparatus according to a first exemplary embodiment. From this figure, it can be seen from where signals are output from pixels PIX. It can also been seen to where the output signals from pixels PIX are output outside the imaging apparatus. In FIG. 1 portion P1 corresponds to pixels in a single column of an matrix of pixels. Each of the other columns of the matrix of pixels have a respective portion P1 also. Consequently, it will be appreciated that in imaging apparatus of FIG. 1 there are a series of portions P placed side-by-side along the row direction of the matrix. In FIG. 1, first direction D1 indicates the column direction, and second direction D2 indicates the row direction.

The imaging apparatus in FIG. 1 includes a pixel region 110 where the plurality of pixels PIX is arranged. According to the present exemplary embodiment, the plurality of pixels PIX is disposed in a matrix. Each of the plurality of pixels PIX includes at least one photoelectric conversion element and generates a signal based on light. The portion P1 includes a plurality of pixels PIX placed in a single column, at least two signal lines 130 and 131, at least two comparators 160 and 161, and at least two counters 170 and 171. A description is given focusing on pixels 100 and 101 from among the plurality of pixels PIX. The pixel 100 is connected to signal line 130 and outputs a signal to signal line 130. The pixel 101 is connected to signal line 131 and outputs a signal to signal line 131. The signal lines 130 and 131 transmit the signals from the pixels connected to the signal lines. For the signal line 130, a current source 140 is provided. For the signal line 131, a current source 141 is provided. To the comparator 160, the signal from the signal line 130 is input. Comparator 161 is arranged to receive the signal from signal line 131 as an input. Further, comparators 160 and 161 as also arranged to receive a ramp signal from a ramp generator 150 as an input. Comparator 160 includes an input node to which the signal from the signal line 130 is input, and an input node to which the ramp signal is input. Comparator 161 includes an input node to which the signal from the signal line 131 is input, and an input node to which the ramp signal is input. Hereinafter, in a comparator, an input node to which a signal from a pixel is input will be referred to as a "first input node", and an input node to which a ramp signal is input will be referred to as a "second input node". In the following description, unless otherwise stated, an "input node" refers to the first input node. Comparator 160 also has an output node connected to counter 170. Likewise, comparator 161 has an output node connected to counter 171. Each of a signal from the counter 170 and a signal from the counter 171 is input to a horizontal scanning circuit 180 and output to outside the imaging apparatus through an output circuit 190. The comparator 160 and the counter 170 form an analog-to-digital converter (hereinafter, an "AD converter"). Similarly, the comparator 161 and the counter 171 form an AD converter.

The portion P1 further includes a configuration for controlling conduction between the signal lines 130 and 131. Specifically, the portion P1 includes switches 201 and 220. In this case, each switch includes at least two terminals, and in the following description, the two terminals will occasionally be referred to as a "first terminal" and a "second terminal". When the switch is ON, a current flows through nodes connected to the two terminals.

The switch 201 can control conduction between the signal line 131 and the comparator 161. The switch 201 includes a first terminal to which the signal from the signal line 131 can be input, and a second terminal from which the signal can be output to the input node of the comparator 161. The first terminal of the switch 201 is connected to the signal line 131, and the second terminal of the switch 201 is connected to the comparator 161. In other words, the first terminal of the switch 201 is connected to the node of the signal line 131, and the second terminal of the switch 201 is connected to the input node of the comparator 161.

The switch 220 can control conduction between the signal line 130 and the comparator 161. The switch 220 includes a first terminal from which a signal can be output to the input node of the second comparator 161, and a second terminal to which the signal from the signal line 130 can be input. The first terminal of the switch 220 is connected to the second comparator 161, and the second terminal of the switch 220 is connected to the signal line 130. In other words, the first terminal of the switch 220 is connected to the input node of the second comparator 161, and the second terminal of the switch 220 is connected to the node of the signal line 130. In yet other words, the first terminal of the switch 220 is connected to the second terminal of the switch 201, or is connected in parallel with the switch 201 to the input node of the comparator 161.

Next, a reading method of the imaging apparatus in FIG. 1 is described. First, in a first operation mode, the switch 201 is ON, and the switch 220 is turned OFF. A signal of the pixel 100 is input from the signal line 130 to the comparator 160 and then subjected to AD conversion. A signal of the pixel 101 is input from the signal line 131 to the comparator 161 and then subjected to AD conversion.

The operation of AD conversion is briefly described. First, a ramp signal of which the potential changes according to the lapse of time is output from the ramp generator 150 to the comparators 160 and 161. The potential of the ramp signal changes in a stepwise or continuous manner. An example is described where the potential of the ramp signal gradually decreases. The signal of the pixel 100 is subjected to AD conversion as follows. If the potential of the ramp signal falls below the potential of the signal line 130, the output of the comparator 160 is inverted (e.g., from high to low). The counter 170 counts the time from a certain time when the comparison between the potentials of the ramp signal and the signal line 130 is started to the time when the output of the comparator 160 is inverted. The result of the counting is the result of the AD conversion of the signal of the pixel 100. The signal of the pixel 101 is subjected to AD conversion as follows. If the potential of the ramp signal falls below the potential of the signal line 131, the output of the comparator 161 is inverted (e.g., from high to low). The counter 171 counts the time from a certain time when the comparison between the potentials of the ramp signal and the signal line 131 is started to the time when the output of the comparator 161 is inverted. The result of the counting is the result of the AD conversion of the signal of the pixel 101.

In the first operation mode, signals of the pixels 100 and 101 are read and subjected to AD conversion in the same reading period. That is, in the first operation mode, signals of the pixels 100 and 101 for two rows can be read and subjected to AD conversion in parallel using the comparators 160 and 161. In this operation, the switch 220 is OFF. Consequently, it is possible to suppress addition of capacitance regarding the signal line 131 to the input node of the comparator 160. Further, the switch 220 is OFF. Consequently, it is possible to suppress addition of capacitance regarding the signal line 130 to the input node of the comparator 161.

Next, a second operation mode is described. In the second operation mode, the switch 220 is turned ON. Since, in a certain period, the switch 220 is ON, and the switch 201 is OFF, a signal of the pixel 100 output to the signal line 130 can be read into the input node of the comparator 161 through the switch 220. Then, the switch 220 is turned OFF, and the switch 201 is turned ON. Consequently, a signal of the pixel 101 output to the signal line 131 can be read into the input node of the comparator 161 through the switch 201. That is, signals of the pixels 100 and 101 in two certain rows can be read from the two signal lines 130 and 131 in order/sequence and subjected to AD conversion using the single comparator 161. As a result, the number of comparators to operate can be half of that in the first operation mode, and therefore, it is possible to reduce current consumption when the imaging apparatus operates. In addition, the number of AD converters to operate in parallel decreases, and therefore, it is possible to reduce noise due to a fluctuation in a power supply voltage.

Further, when the signal of the signal line 130 is subjected to AD conversion by the comparator 161, the switch 201 is turned OFF. Consequently, addition of capacitance accompanying the signal line 131 to the input node of the comparator 161 is reduced. It is therefore possible to suppress a decrease in the operation speed in the reading of a signal. More specifically, it is possible to suppress a decrease in the reading operation speed in a configuration in which a switch is included between a plurality of signal lines.

Figure 2:
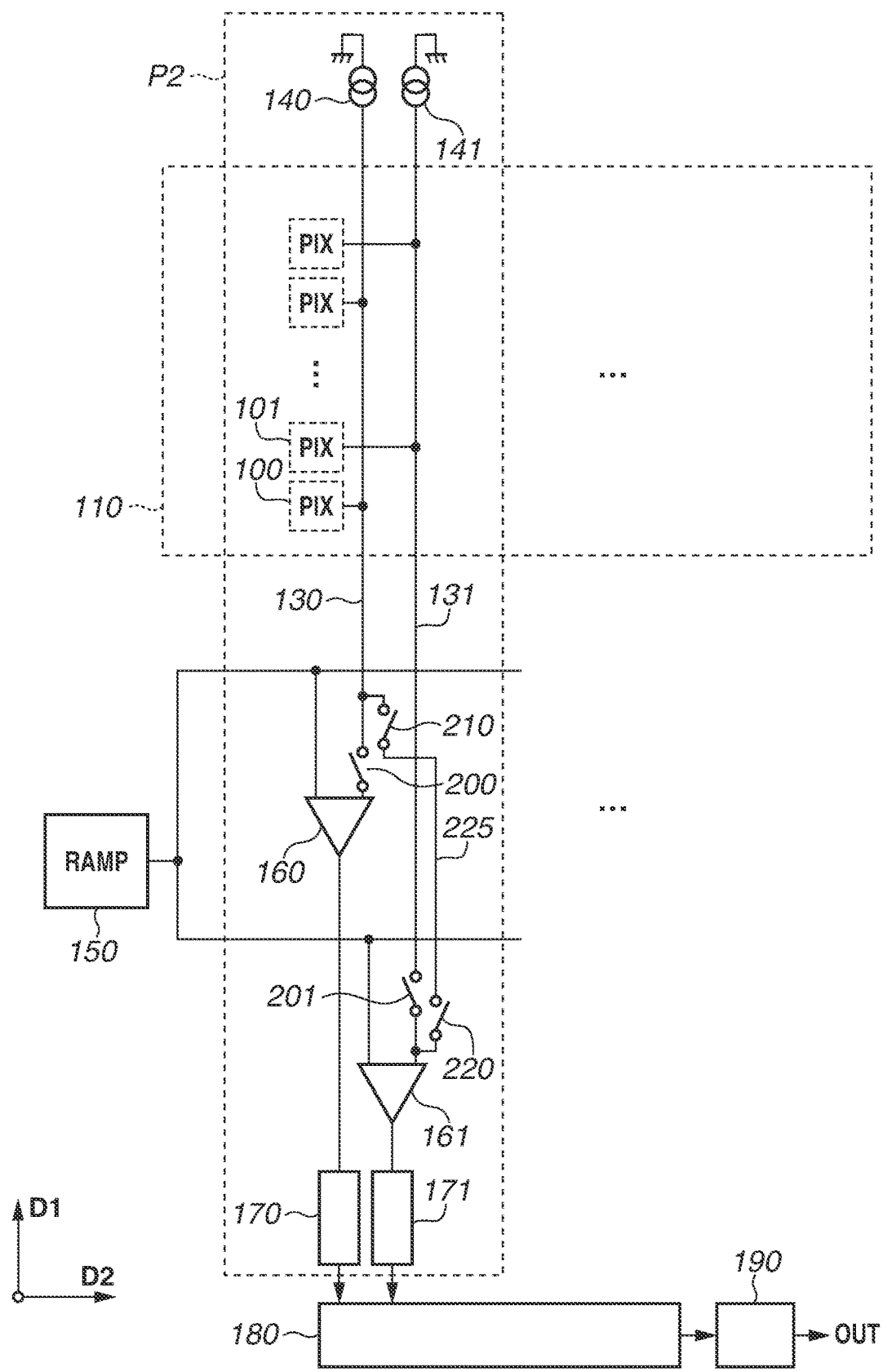
FIG. 2 is a schematic diagram of an imaging apparatus according to a second exemplary embodiment.

FIG. 2 is a schematic diagram of an imaging apparatus for describing a second exemplary embodiment. In the present exemplary embodiment, components similar to those in the first exemplary embodiment are designated by the same signs, and descriptions for those components are omitted. The differences from the first exemplary embodiment are described below.

In FIG. 2, the imaging apparatus includes a portion P2 corresponding to the portion P1 in FIG. 1. In FIG. 2, in other columns, similar portions P2 are repeatedly placed in the second direction D2. In comparison with the portion P1 in FIG. 1, the portion P2 further includes switches 200 and 210 and a bypass line 225. Specifically, in the portion P2, the switch 210 and the bypass line 225 are provided between the second terminal of the switch 220 and the node of the signal line 130 which are also provided in the portion P1. The bypass line 225 is a signal path connecting the signal lines 130 and 131. According to the present exemplary embodiment, the bypass line 225 at least includes a wiring line. Alternatively, the bypass line 225 may be a semiconductor region to which two switches are connected.

The switch 200 can control conduction between the signal line 130 and the comparator 160. The switch 200 includes a first terminal to which the signal from the signal line 130 can be input, and a second terminal from which the signal can be output to the input node of the comparator 160. The first terminal of the switch 200 is connected to the signal line 130, and the second terminal of the switch 200 is connected to the comparator 160. In other words, the first terminal of the switch 200 is connected to the node of the signal line 130, and the second terminal of the switch 200 is connected to the input node of the comparator 160.

The switch 210 can control conduction between the signal line 130 and the bypass line 225. The switch 210 includes a first terminal to which the signal from the signal line 130 can be input, and a second terminal from which the signal can be output to the bypass line 225. The first terminal of the switch 210 is connected to the signal line 130, and the second terminal of the switch 210 is connected to the bypass line 225. In other words, the first terminal of the switch 210 is connected to the node of the signal line 130, and the second terminal of the switch 210 is connected to the node of the bypass line 225. Further, in yet other words, the second terminal of the switch 210 is connected to the second terminal of the switch 220, or is connected in parallel with the switch 200 to the signal line 130.

According to the present exemplary embodiment, the switch 220 can control conduction between the bypass line 225 and the comparator 161. The first terminal of the switch 220 is connected to the comparator 161, and the second terminal of the switch 220 is connected to the bypass line 225. In other words, the first terminal of the switch 220 is connected to the input node of the comparator 161, and the second terminal of the switch 220 is connected to the node of the bypass line 225. Further, in yet other words, the first terminal of the switch 220 and the second terminal of the switch 201 are connected to the same input node of the comparator 161. Additionally, the second terminal of the switch 220 can electrically connect to the signal line 130 through the switch 210 and the bypass line 225.

A reading method according to the present exemplary embodiment is described. According to the present exemplary embodiment, the imaging apparatus can also have first and second operation modes similar to those according to the first exemplary embodiment. First, the first operation mode is described. First, the switches 200 and 201 are turned ON, and the switches 210 and 220 are turned OFF. In this state, a signal from the pixel 100 is input to the comparator 160 through the signal line 130 and the switch 200. In the same period, a signal from the pixel 101 is input to the comparator 161 through the signal line 131 and the switch 201. The operation after the signals are input to the comparators 160 and 161 is similar to that according to the first exemplary embodiment. More specifically, signals of two pixels can be read and subjected to AD conversion in the same period and/or in parallel.

Since the switch 210 is provided, it is possible to reduce the influence of the capacitance of the signal line 131 and the bypass line 225 on the input node of the comparator 160. Further, since the switch 220 is provided, it is possible to reduce the influence of the capacitance of the signal line 130 and the bypass line 225 on the input node of the comparator 161. In this operation, the bypass line 225 is floating, and therefore, a switch for connecting the bypass line 225 to the ground voltage GND or a power supply voltage VDD to fix the potential of the bypass line 225 may be provided.

The second operation mode is described. First, the switches 200 and 201 are OFF, and the switches 210 and 220 are turned ON. A signal from the pixel 100 is output to the input node of the comparator 161 via the signal line 130, the switch 210, the bypass line 225, and the switch 220 in this order. Then, the signal from the pixel 100 is subjected to AD conversion. Subsequently, at least the switch 220 is OFF (but preferably switch 220 is turned OFF together with switch 210), and the switch 201 is turned ON. A signal from the pixel 101 is output to the input node of the comparator 161 via the signal line 131 and the switch 201 in this order. Then, the signal from the pixel 101 is subjected to AD conversion. By switching the switches 201 and 220 as described above, it is possible to independently input each of the signal of the pixel 100 and the signal of the pixel 101 to the comparator 161.

According to the present exemplary embodiment, when the signal of the pixel 100 is input to the comparator 161, the switch 200 is OFF. It is therefore possible to reduce addition of capacitance accompanying the comparator 160 to the signal line 130. As a result, a decrease in the operation speed in the reading of a signal can be suppressed. Further, when the signal of the pixel 100 is input to the comparator 161, the switch 201 is OFF. It is therefore possible to reduce addition of capacitance accompanying the signal line 131 to the input node of the comparator 161. As a result, a decrease in the operation speed in the reading of a signal can be suppressed.

Further, when the signal of the pixel 101 is input to the comparator 161, the switch 220 is OFF. It is therefore possible to reduce addition of capacitance accompanying the bypass line 225 or the signal line 130 to the signal line 131 or the input node of the comparator 161.

According to the present exemplary embodiment, a configuration in which the bypass line 225 is provided has been described. Alternatively, a configuration in which the bypass line 225 is not provided and the terminal of the switch 220 and the terminal of the switch 210 are directly connected together may be employed. Further, the bypass line 225 according to the present exemplary embodiment at least includes a wiring line, but can include a portion (a contact plug or a via plug) connected to the same node.

Figure 3:
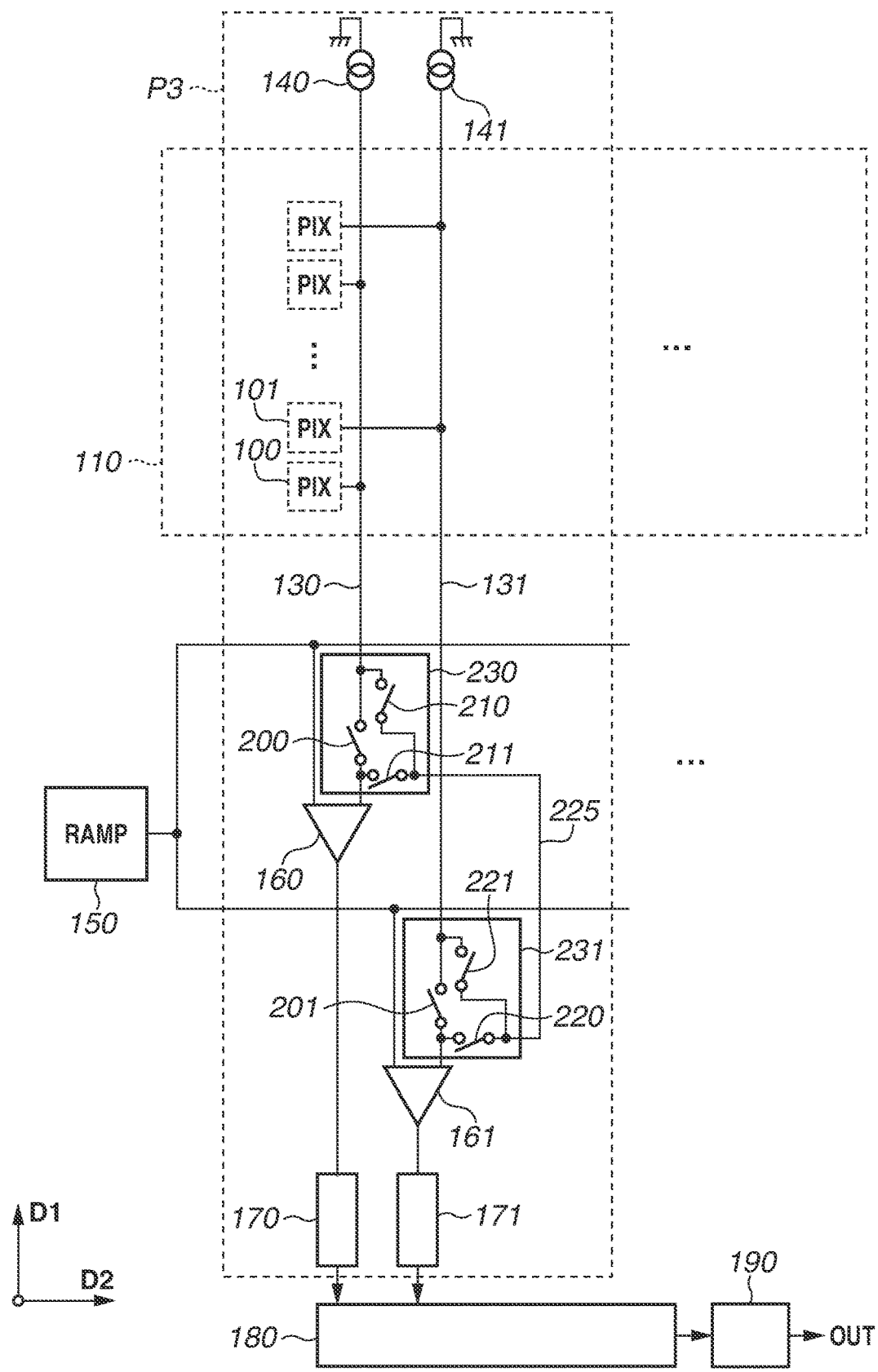
FIG. 3 is a schematic diagram of an imaging apparatus according to a third exemplary embodiment.

FIG. 3 is a schematic diagram illustrating an imaging apparatus of a third exemplary embodiment. According to the present exemplary embodiment, components similar to those in the other exemplary embodiments are designated by the same signs, and descriptions for those components are omitted. The differences from the other exemplary embodiments are described below.

A portion P3 illustrated in FIG. 3 corresponds to the portion P1 in FIG. 1 or the portion P2 in FIG. 2. In FIG. 3, in other columns, similar portions P3 are repeatedly placed in the second direction D2. In addition to the components illustrated in the portion P2 in FIG. 2, the portion P3 includes switches 211 and 221.

The switch 211 can control conduction between the comparator 160 and the bypass line 225. The switch 211 includes a first terminal from which a signal can be output to the comparator 160, and a second terminal to which a signal from the bypass line 225 can be input. The first terminal of the switch 211 is connected to the comparator 160, and the second terminal of the switch 211 is connected to the bypass line 225. In other words, the first terminal of the switch 211 is connected to the input node of the comparator 160, and the second terminal of the switch 211 is connected to the node of the bypass line 225. In yet other words, the first terminal of the switch 211 is connected to the second terminal of the switch 200. In yet other words, the second terminal of the switch 211 is connected to the second terminal of the switch 220, or is connected to the second terminal of the switch 210.

The switch 221 can control conduction between the signal line 131 and the bypass line 225. The switch 221 includes a first terminal to which the signal from the signal line 131 can be input, and a second terminal from which the signal can be output to the bypass line 225. The first terminal of the switch 221 is connected to the signal line 131, and the second terminal of the switch 221 is connected to the bypass line 225. In other words, the first terminal of the switch 221 is connected to the node of the signal line 131, and the second terminal of the switch 221 is connected to the node of the bypass line 225. In yet other words, the first terminal of the switch 221 is connected to the first terminal of the switch 201. In yet other words, the second terminal of the switch 221 is connected to the second terminal of the switch 220, or is connected to the second terminal of the switch 211, or is connected to the second terminal of the switch 210.

According to the second exemplary embodiment, addition of capacitance in a case where the comparator 161 is used can be reduced. According to the present exemplary embodiment, the switches 211 and 221 are further included. Consequently, it is possible to reduce addition of capacitance, no matter which of the two comparators 160 and 161 is used.

For convenience, the switches in FIG. 3 are defined as switch units 230 and 231. The switch unit 230 at least includes the switches 200, 210, and 211, and the switch unit 231 at least includes the switches 201, 220, and 221. As illustrated in FIG. 3, the portion P3 includes a plurality of switch units. The plurality of switch units is provided in such a manner that each of the plurality of switch units corresponds to a different one of a plurality of signal lines (the signal lines 130, 131, . . . ) and one of a plurality of comparators (the comparators 160, 161, . . . ). Each switch unit includes at least three types of switches. A first type switch includes a first terminal connected to a corresponding one of the plurality of signal lines, and a second terminal connected to a corresponding one of the plurality of comparators. The switch 200 of the switch unit 230 and the switch 201 of the switch unit 231 correspond to the first type switch. A second type switch includes a first terminal connected to a corresponding one of the plurality of signal lines (and the first terminal of the first type switch connected to the signal line), and a second terminal connected to the bypass line 225. The switch 210 of the switch unit 230 and the switch 221 of the switch unit 231 correspond to the second type switch. A third type switch includes a first terminal connected to a corresponding one of the plurality of comparators (and the second terminal of the first type switch connected to the comparator), and a second terminal connected to the bypass line 225. The switch 211 of the switch unit 230 and the switch 220 of the switch unit 231 correspond to the third type switch. With these switches, as described below, in a second operation mode, it is possible to equalize the numbers of switches in the signal paths of the pixels 100 and 101. In other words, the bypass line 225 is commonly connected to the plurality of switch units.

A reading method according to the present exemplary embodiment is described. Also according to the present exemplary embodiment, the imaging apparatus can have first and second operation modes similar to the configurations according to the first and second exemplary embodiments. First, the first operation mode is described. In the first operation mode, in each switch unit, the first type switch is ON, and the second type and third type switches are OFF. In this operation, a signal of each pixel is input to a corresponding one of the comparators through a signal line to which the pixel is connected and via the first type switch of a corresponding one of the switch units. Specifically, the switches 200 and 201 are ON, and the switches 210, 211, 220, and 221 are OFF. In this state, a signal of the pixel 100 is input to the comparator 160, and a signal of the pixel 101 is input to the comparator 161. Since the switches 210, 211, 220, and 221 are OFF, capacitance accompanying the bypass line 225 is not added to either of the signal lines 130 and 131. Thus, in this operation mode, the bypass line 225 provided to this configuration does not influence the speed. Additionally, a switch for connecting the bypass line 225 to the ground voltage GND or a power supply voltage VDD may be separately provided in the bypass line 225.

Next, the second operation mode is described, In the second operation mode, in each switch unit, the first type switch is OFF. Then, the third type switch of any one of the plurality of switch units commonly connected to the bypass line is ON. The third type switch of the other of the plurality of switch units commonly connected to the bypass line is OFF. Then, the second type switch of each switch unit sequentially turn ON from OFF. In this operation, a signal of each pixel is sequentially input to a different one of the comparators corresponding to the switch unit of which the third type switch is ON, through a signal line to which the pixel is connected, via the second type switch of the corresponding switch unit, and via the bypass line. Specifically, the switches 200, 201, and 211 are OFF, and the switch 220 is ON. In this state, since the switches 210 and 221 are sequentially turned ON, a signal of the pixel 100 and a signal of the pixel 101 are sequentially input to the comparator 161. As described above, also according to the present exemplary embodiment, signals can be read in the second operation mode.

According to the second operation mode, the reading path of the signal of the pixel 100 from the pixel 100 to the comparator 161 includes the signal line 130, the switch 210, the bypass line 225, and the switch 220 in this order. Similarly, the reading path of the signal of the pixel 101 from the pixel 101 to the comparator 161 includes the signal line 131, the switch 221, the bypass line 225, and the switch 220 in this order. That is, the numbers of switches in the paths up to the input of the signals from the pixels to the comparators are equal, and noise that can occur in each signal is equal.

Further, in the second operation mode, capacitance regarding the reading path of the signal of the pixel 100 is the sum of capacitances regarding the two switches, the signal line 130, and the bypass line 225. Further, capacitance regarding the reading path of the signal of the pixel 101 is the sum of capacitances regarding the two switches, the signal line 131, and the bypass line 225. Thus, it is possible to reduce variations in gain and variations in reading speed in the reading of the signals of the pixels 100 and 101.

Further, in the second operation mode, since the switches 200 and 211 are OFF, it is possible to reduce addition of capacitance regarding the comparator 160 to the reading path of a signal. Further, since the switch 201 is OFF, it is possible to reduce addition of capacitance regarding the signal line 131 when a signal of the pixel 100 is read. Thus, it is possible to suppress a decrease in the reading speed.

According to the present exemplary embodiment, an example has been illustrated where the comparator 161 is used in the second operation mode. Alternatively, the comparator 160 may be used. In this case, the switch 211 is ON, the switches 220, 200, and 201 are OFF, and the switches 210 and 221 are sequentially turned ON. Since The switches 200 and 210 are OFF, it is possible to reduce the influence of capacitance accompanying the signal line 130. Since the switches 201 and 220 are OFF, it is possible to reduce the influence of capacitance accompanying the comparator 161.

The imaging apparatus may further have a third operation mode. The third operation mode is the operation of, in the second operation mode, further turning ON the plurality of third type switches among the switch units commonly connected to the bypass line. A signal of a single pixel is input to the plurality of comparators via the plurality of third type switches which are ON. Specifically, the third operation mode is the operation of, in the example of the second operation mode, further turning ON the switch 211, inputting a signal from a single pixel to the two comparators 160 and 161, performing AD conversion of the signals. In this case, the switches 211 and 220 are ON, and the switches 200 and 201 are OFF. Then, the switches 210 and 221 are sequentially turned ON. As a result, a signal from the signal line 130 can be input to the comparators 160 and 161, and then, a signal from the signal line 131 can be input to the comparators 160 and 161. By such an operation, two digital signals can be obtained from a single signal. Thus, it is possible to reduce noise due to the comparators. In other words, it is easy to remove noise due to the comparators.

In the first to third operation modes, each of the plurality of switch units has the following four states. A first state is the state where a signal of one of the signal lines is input to one of the comparators corresponding to the one signal line. That is, the first type switch is ON, and the second type and third type switches are OFF. A second state is the state where a signal of one of the signal lines is output to the bypass line. In this case, the second type switch is ON, and the first type and third type switches are OFF. A third state is the state where a signal of one of the signal lines is output to both of one of the comparators corresponding to the one signal line and the bypass line. In the third state, at least the first type and second type switches are ON. A fourth state is the state where a signal of the bypass line is input to one of the comparators corresponding to one of the signal lines. In the fourth state, the third type switch is ON, and the first type and second type switches are OFF.

Figure 4:
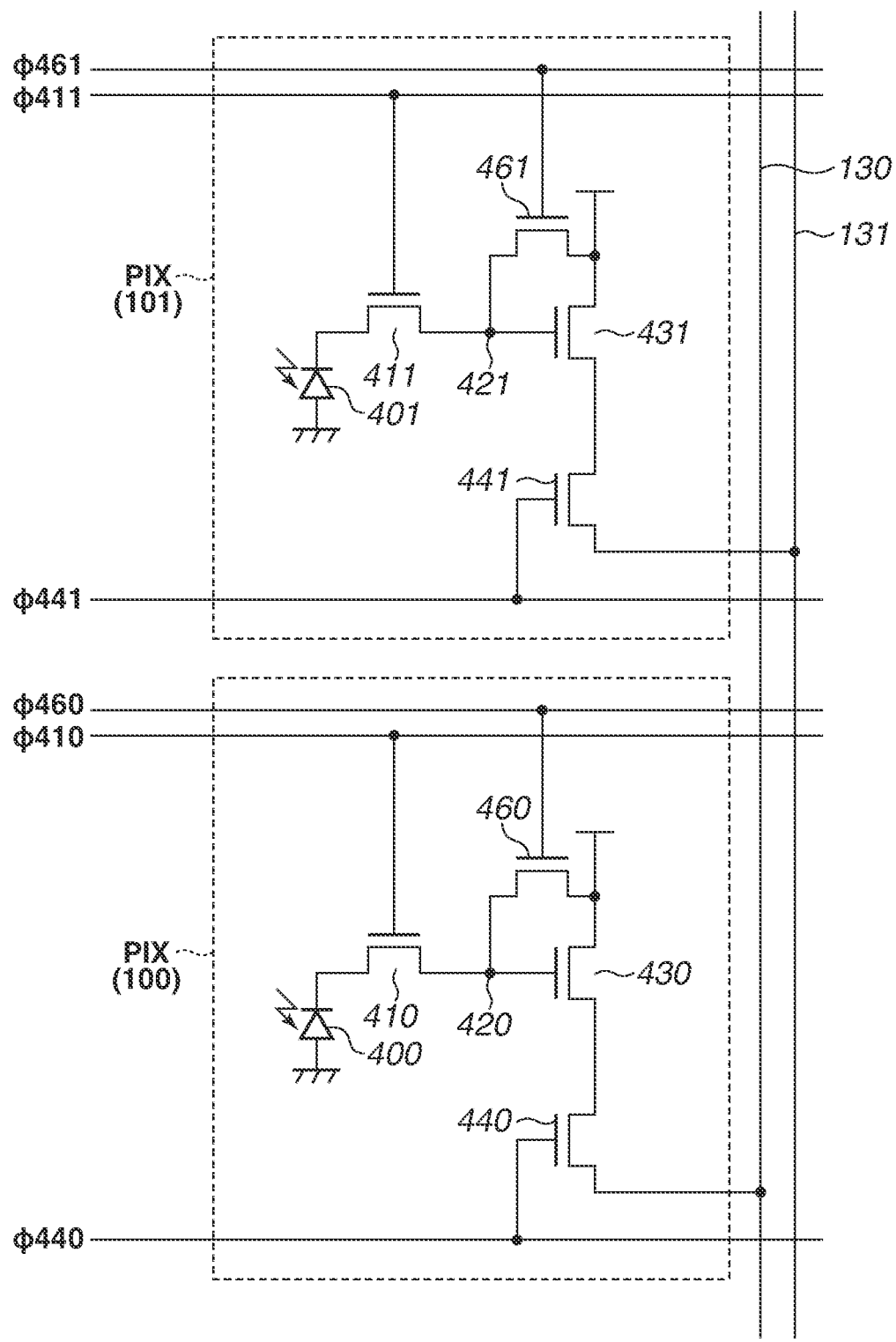
FIG. 4 is a schematic diagram of the imaging apparatus according to the third exemplary embodiment.
Figure 5:
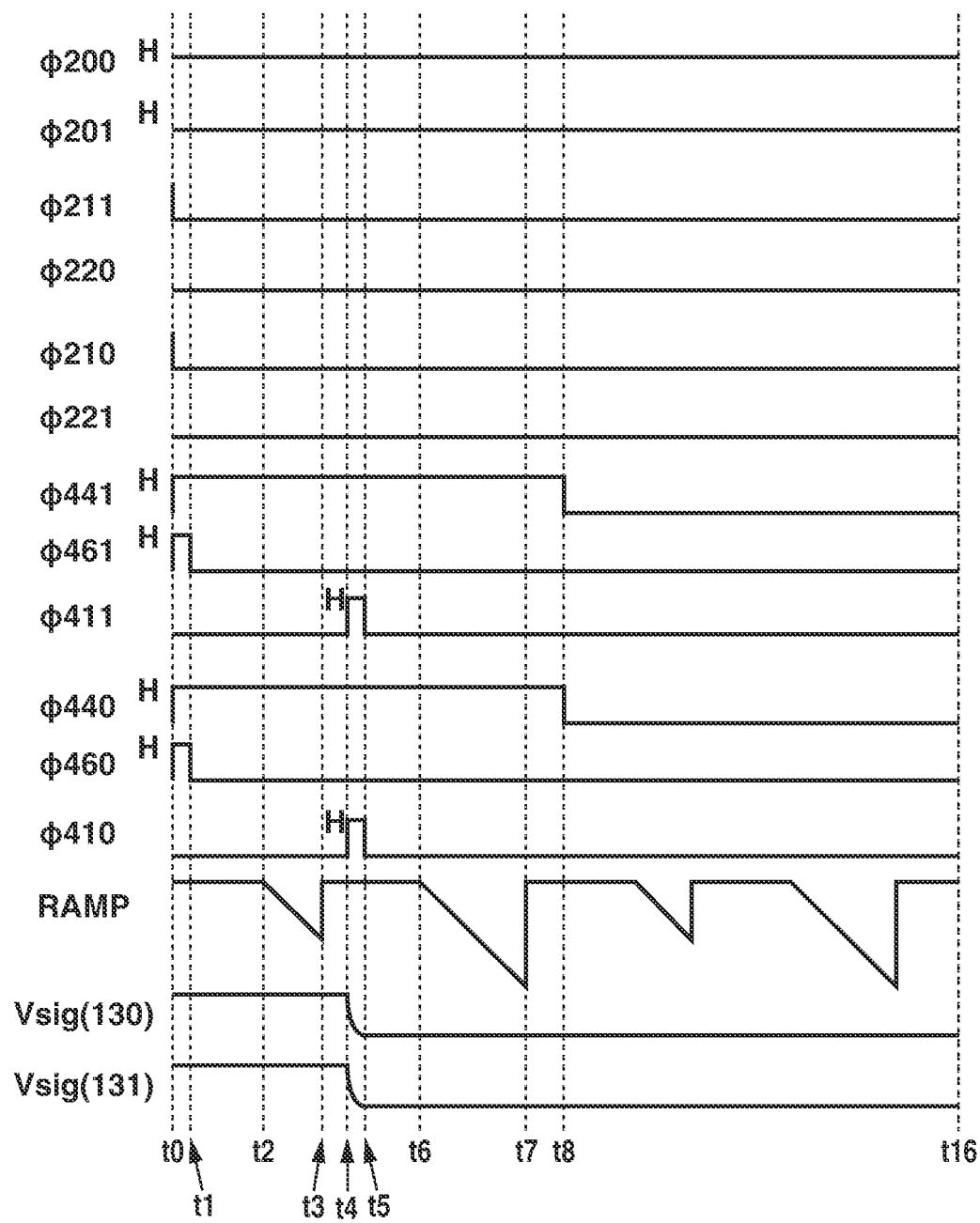
FIG. 5 is a schematic diagram of the imaging apparatus according to the third exemplary embodiment.
Figure 6:
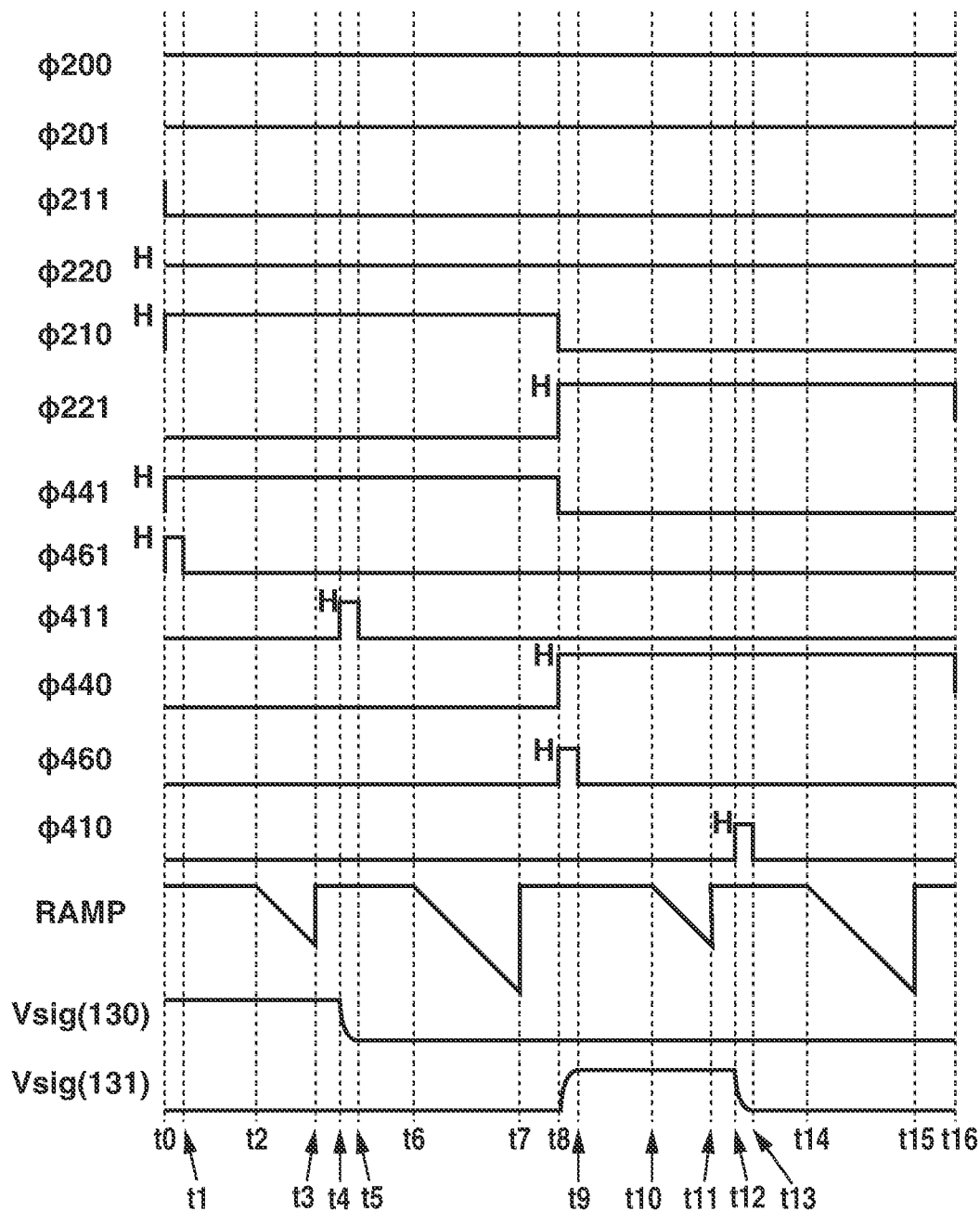
FIG. 6 is a schematic diagram of the imaging apparatus according to the third exemplary embodiment.

With reference to FIGS. 4 to 6, the specific operations of the first and second operation modes are described. FIG. 4 is a circuit diagram of the pixels 100 and 101 illustrated in FIG. 3. The pixel 100 includes a photoelectric conversion element 400, a transfer transistor 410, an amplification transistor 430, a selection transistor 440, and a reset transistor 460. The pixel 101 includes a photoelectric conversion element 401, a transfer transistor 411, an amplification transistor 431, a selection transistor 441, and a reset transistor 461. The pixels 100 and 101 include floating diffusion regions (hereinafter, "FD regions") 420 and 421, respectively. Charges are transferred from the photoelectric conversion elements 400 and 401 to the FD regions 420 and 421, respectively. Signals based on the potentials of the FD regions 420 and 421 are output from the amplification transistors 430 and 431 to the signal lines 130 and 131 through the selection transistors 440 and 441, respectively. Further, the FD regions 420 and 421 are set to predetermined potentials by the reset transistors 460 and 461, respectively. Generally, the imaging apparatus includes a microlens array. A single microlens is provided for each of the pixels 100 and 101. As described above, the pixel configuration illustrated in FIG. 4 is the pixel configuration of a typical CMOS image sensor, and is not described in detail here.

At least one photoelectric conversion element may be provided in the pixels 100 and 101 and, in some embodiments, a single microlens may be provided over at least two pixels 100 and 101 adjacent to each other. The at least two pixels 100 and 101 are at least disposed adjacent to each other along the first direction D1 or the second direction D2. For example, a single microlens may be disposed over four pixels disposed in the first direction D1 and the second direction D2. Further, the at least two pixels 100 and 101 may be disposed along a direction other than the first direction D1 and the second direction D2.

FIG. 5 is a schematic diagram illustrating a driving method in the first operation mode of the imaging apparatus illustrated in FIGS. 3 and 4. FIG. 6 is a schematic diagram illustrating a driving method in the second operation mode of the imaging apparatus illustrated in FIGS. 3 and 4. In each of FIGS. 5 and 6, the horizontal axis represents time, and the vertical axis represents a control pulse to be input to each element, a potential RAMP of a ramp signal, a potential Vsig(130) indicating the potential of the signal line 130, and a potential Vsig(131) indicating the potential of the signal line 131. A control pulse Φ200 is input to the switch 200 and controls the state (ON and OFF) of the switch 200. A control pulse Φ201 is input to the switch 201 and controls the state (ON and OFF) of the switch 201. Similarly, each of other control pulses Φ211, Φ220, Φ210, Φ221, Φ441, Φ461, Φ411, Φ440, Φ460, and Φ410 is also input to a switch or a transistor having a corresponding sign and controls the state of the switch or the transistor. Each control pulse can take any value, but in this case, takes two values, namely a high level H and a low level L, for ease of description. For example, the high level H and the low level L are 3.3 V and 0 V, respectively. When the control pulse is at the high level H, the switch or the transistor is ON, and when the control pulse is at the low level L, the switch or the transistor is OFF. In each figure, a portion where the control pulse is at the high level H is designated as "H".

First, the operations of the elements in the first operation mode illustrated in FIG. 5 are described. From a time t0 to a time t8, the control pulses Φ200 and Φ201 are at the high level H, and the control pulses Φ211, Φ220, Φ210, and Φ221 are at the low level L. That is, the switches 200 and 201 are ON, and the switches 211, 220, 210, and 221 are OFF. In this state, a reading operation of the pixel 101 and a reading operation of the pixel 100 are performed.

From the time t0 to the time t8, the control pulses Φ441 and Φ440 are at the high level H, and the selection transistors 441 and 440 are ON. Between the time t0 and a time t1, the control pulses Φ461 and Φ460 are at the high level H, the reset transistors 460 and 461 are ON, and the FD regions 421 and 420 are set to the predetermined potentials. At this time, the potential Vsig(131) of the signal line 131 indicates a signal (a reset signal) based on the reset potential of the FD region 421. The potential Vsig(130) of the signal line 130 indicates a signal (a reset signal) based on the reset potential of the FD region 420. From a time t2 to a time t3, a ramp signal indicated by the potential RAMP is input to the comparators 161 and 160. Each of the reset signal of the pixel 101 and the reset signal of the pixel 100 is subjected to AD conversion. Each of the output of the comparator 160 and the output of the comparator 161 is inverted between the time t2 and the time t3, and the counters 170 and 171 output count values at that time. From the time t3 to a time t4, the reset signals after the AD conversion are output through the output circuit 190. From the time t4 to a time t5, the control pulse Φ411 is at the high level H, the transfer transistor 411 is turned ON, and a charge generated in the photoelectric conversion element 401 according to light input to the photoelectric conversion element 401 is transferred to the FD region 421. At the same time, the control pulse Φ410 is at the high level H, the transfer transistor 410 is turned ON, and a charge generated in the photoelectric conversion element 400 according to light input to the photoelectric conversion element 400 is transferred to the FD region 420. At this time, the potential Vsig(131) of the signal line 131 indicates a signal (an optical signal) based on the potential of the PD region 421 to which the charge is transferred from the photoelectric conversion element 401. Similarly, the potential Vsig(130) of the signal line 130 indicates a signal (an optical signal) based on the potential of the FD region 420 to which the charge is transferred from the photoelectric conversion element 400. From a time t6 to a time t7, a ramp signal indicated by the potential RAMP is input to the comparators 161 and 160, and the optical signals of the pixels 101 and 100 are subjected to AD conversion. Each of the output of the comparator 161 and the output of the comparator 160 is inverted between the time t6 and the time t7, and the counters 170 and 171 output count values at that time. From the time t7 to the time t8, the optical signals after the AD conversion are output to outside. At the time t8, the reading operations for reading signals from the pixels 101 and 100 end. From the time t8 to a time t16, as a next frame, the operations from the time t0 to the time t8 may be repeated. As described above, with the first operation mode according to the present exemplary embodiment, it is possible to simultaneously perform AD conversion of signals from two pixels and read the signals.

Next, the operations of the elements in the second operation mode illustrated in FIG. 6 are described. From a time t0 to a time t16, the control pulses Φ200, Φ201, and Φ211 are at the low level L, and the control pulse Φ220 is at the high level H. That is, the switches 200, 201, and 211 are OFF, and the switch 220 is ON. In this case, the control pulse Φ210 is at the high level H from the time t0 to a time t8, and the control pulse Φ221 is at the high level H from the time t8 to the time t16. That is, the control pulses Φ210 and Φ221 are sequentially set to the high level H.

In this case, a reading operation of the pixel 101 from the time t0 to the time t8 is performed. This is similar to the reading operation of the pixel 101 from the time t0 to the time t8 in FIG. 5. From the time t0 to the time t8, the control pulse Φ441 is at the high level H, the control pulse Φ440 is at the low level L, the selection transistor 441 is ON, and the selection transistor 440 is OFF. Between the time t0 and a time t1, the control pulse Φ461 is at the high level H, the reset transistor 461 is on, and the FD region 421 is set to the predetermined potential. At this time, the potential Vsig(131) of the signal line 131 indicates a signal (a reset signal) based on the reset potential of the PD region 421. The potential Vsig(130) of the signal line 130 does not change. From a time t2 to a time t3, a ramp signal indicated by the potential RAMP is input to the comparator 161, and the reset signal of the pixel 101 is subjected to AD conversion. The output of the comparator 161 is inverted between the time t2 and the time t3, and the counter 171 outputs a count value at that time. Between the time t3 and a time t4, the reset signal of the pixel 101 after the AD conversion is output through the output circuit 190. From the time t4 to a time t5, the control pulse Φ411 is at the high level H, the transfer transistor 411 is turned ON, and a charge generated in the photoelectric conversion element 401 according to light input to the photoelectric conversion element 401 is transferred to the FD region 421. The potential Vsig(131) of the signal line 131 indicates a signal (an optical signal) based on the potential of the FD region 421 to which the charge is transferred from the photoelectric conversion element 401. From a time t6 to a time t7, a ramp signal indicated by the potential RAMP is input to the comparator 161, and the optical signal of the pixel 101 is subjected to AD conversion. The output of the comparator 161 is inverted between the time t6 and the time t7, and the counter 171 outputs a count value at that time. From the time t7 to the time t8, the optical signal of the pixel 101 after the AD conversion is output to outside. At the time t8, the reading operation for reading a signal from the pixel 101 ends.

From the time t8 to the time t16, a reading operation of the pixel 100 is performed. This is similar to the reading operation of the pixel 100 from the time t0 to the time t8 in FIG. 5. From the time t8 to the time t16, the control pulse Φ441 is at the low level L, the control pulse Φ440 is at the high level H, the selection transistor 441 is OFF, and the selection transistor 440 is ON. Between the time t8 and a time t9, the control pulse Φ460 is at the high level H, the reset transistor 460 is ON, and the FD region 420 is set to the predetermined potential. At this time, the potential Vsig(130) of the signal line 130 indicates a signal (a reset signal) based on the reset potential of the PD region 420. From a time t10 to a time t11, a ramp signal indicated by the potential RAMP is input to the comparator 160, and the reset signal of the pixel 100 is subjected to AD conversion. The output of the comparator 160 is inverted between the time t10 and the time t11, and the counter 170 outputs a count value at that time. Between the time t11 and a time t12, the reset signal of the pixel 100 after the AD conversion is output through the output circuit 190. From the time t12 to a time t13, the control pulse Φ410 is at the high level H, the transfer transistor 410 is turned ON, and a charge generated in the photoelectric conversion element 400 according to light input to the photoelectric conversion element 400 is transferred to the FD region 420. At this time, the potential Vsig(130) of the signal line 130 indicates a signal (an optical signal) based on the potential of the PD region 420 to which the charge is transferred from the photoelectric conversion element 400. From a time t14 to a time t15, a ramp signal indicated by the potential RAMP is input to the comparator 160, and the optical signal of the pixel 100 is subjected to AD conversion. The output of the comparator 160 is inverted between the time t14 and the time t15, and the counter 170 outputs a count value at that time. From the time t15 to the time t16, the optical signal of the pixel 100 after the AD conversion is output to outside. At the time t16, the reading operation for reading a signal from the pixel 100 ends.

In the second operation mode, reading operations for reading signals from a plurality of pixels that are simultaneously performed in the first operation mode are sequentially performed. In this operation, the switches 200, 201, and 211 are OFF, and the switch 220 is ON. Thus, signals of the two pixels 100 and 101 can be read in paths using the single comparator 161, without using the comparator 160. Since the imaging apparatus has the second operation mode, the number of elements to operate decreases. As a result, it is possible to achieve low power. Additionally, since the number of comparators to operate in parallel decreases, it is possible to reduce noise due to a fluctuation in a power supply voltage or a change in the output of a comparator.

Further, the third operation mode can be achieved by, in the second operation mode illustrated in FIG. 6, setting the control pulse Φ211 to the high level H and turning ON the switch 211 between the time t0 and the time t16. In this case, from the time t0 to the time t8 in FIG. 6, a signal from the pixel 101 is input to the two comparators 160 and 161 and subjected to AD conversion. Then, from the time t8 to the time t16 in FIG. 6, a signal from the pixel 100 is input to the two comparators 160 and 161 and subjected to AD conversion.

According to the present exemplary embodiment, the single bypass line 225 connects two signal lines and two comparators through switches. However, when the bypass line 225 connects three or more signal lines and three or more comparators through switches, it is possible to connect the signal lines and the comparators without increasing the number of switches. For example, in a case where a bypass line is not used to connect three signal lines and three comparators, three switches are required for the input node of a single comparator. Thus, a total of nine switches need to be provided. However, in a case where a bypass wiring line is provided as the configuration according to the present exemplary embodiment, only two switches need to be provided for the input node of a single comparator.

Figure 7:
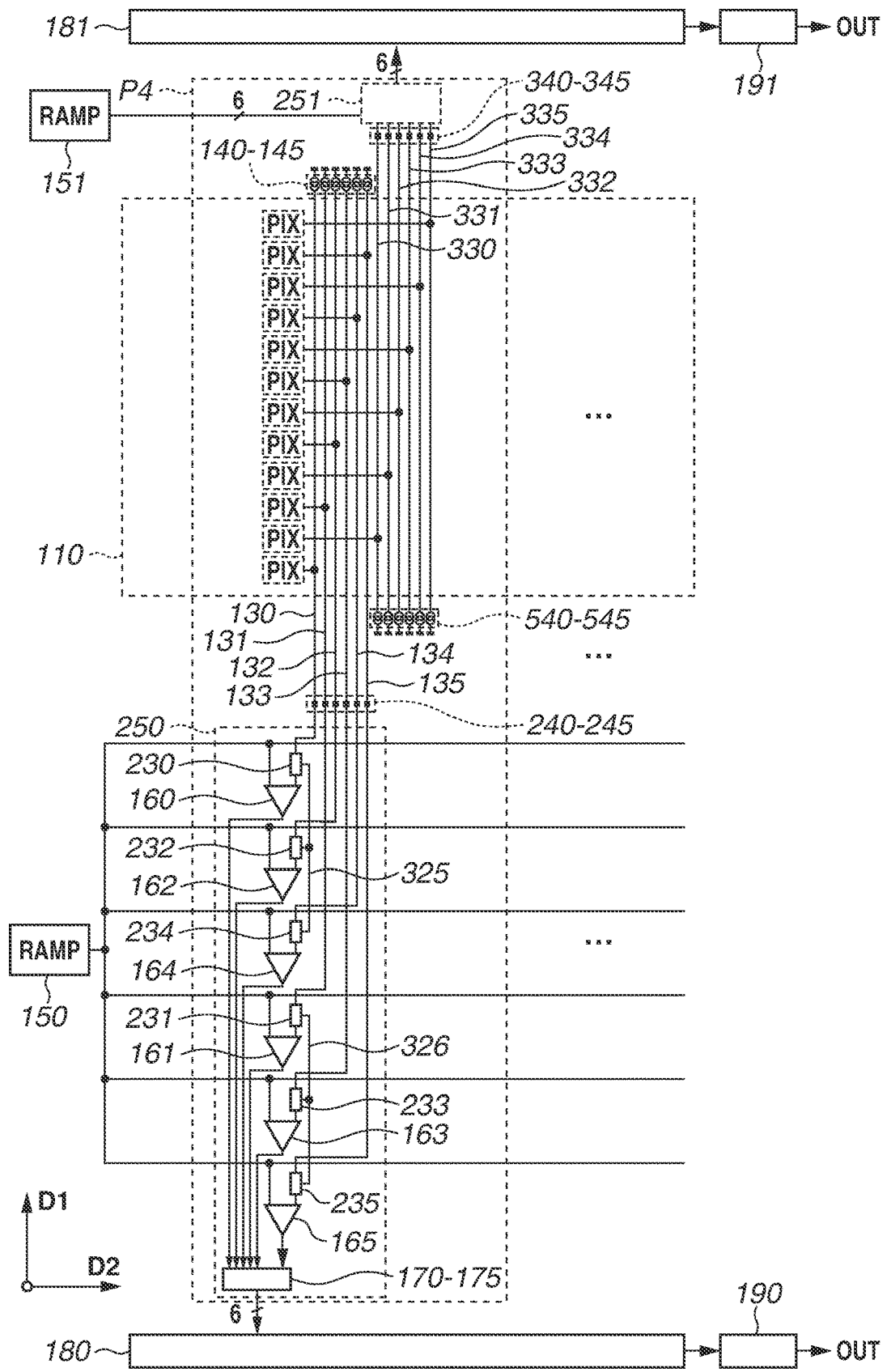
FIG. 7 is a schematic diagram of an imaging apparatus according to a fourth exemplary embodiment.

FIGS. 7, 8A, and 8B are schematic diagrams of an imaging apparatus for describing a fourth exemplary embodiment. According to the present exemplary embodiment, an imaging apparatus including a plurality of semiconductor substrates for lamination is illustrated. As illustrated in FIG. 7, the laminated-type imaging apparatus according to the present exemplary embodiment at least includes a semiconductor substrate including a pixel region 110 on which a plurality of pixels PIX is disposed, and another semiconductor substrate including components other than the pixel region 110. The semiconductor substrate on which the pixel region 110 is disposed is also referred to as a "pixel chip". Further, the semiconductor substrate on which a circuit other than the pixel region 110 is disposed is also referred to as a "circuit chip". The imaging apparatus may further include a semiconductor substrate on which a signal processing circuit for an image signal and a circuit for a control system of the pixel region 110 are disposed, and may include three or more semiconductor substrates for lamination. Such an imaging apparatus is also referred to as a "laminated-type imaging apparatus".

In the imaging apparatus according to the present exemplary embodiment, 12 signal lines 130 to 135 and 330 to 335 are provided for pixels PIX in a single column. For the six signal lines 130 to 135 among the 12 signal lines, a reading circuit 250 is provided in a direction opposite to the first direction D1. For the other six signal lines 330 to 335, a reading circuit 251 is provided in the first direction D1. In FIG. 7, similarly to the other exemplary embodiments, a portion corresponding to pixels in a single column is referred to as a "portion P4".

Further, the imaging apparatus according to the present exemplary embodiment is of a laminated type and therefore includes connection portions 240 to 245 and 340 to 345 for transmitting and receiving signals between the plurality of semiconductor substrates. Each of the connection portions 240 to 245 and 340 to 345 is composed of a conductor. For example, a joint portion may be Cu—Cu bonding formed by bonding wiring lines containing copper as a main component and provided in two substrates. Alternatively, the joint portion may be composed of an electrode pad and a bump, or may be formed of a through-silicon via (TSV).

In FIG. 7, a description is given using 12 pixels PIX as examples. The 12 pixels PIX are arranged in a single column and 12 rows and connected to the 12 signal lines 130 to 135 and 330 to 335 on a one-to-one basis. In this case, 12 current sources 140 to 145 and 540 to 545 are connected to the 12 corresponding signal lines 130 to 135 and 330 to 335 on a one-to-one basis. Similarly to FIGS. 1 to 3, the plurality of pixels PIX is connected to the signal lines 130 to 135 and 330 to 335. For example, in a single column, a set of the pixels PIX in 12 rows illustrated in FIG. 4 is repeatedly disposed along the column direction (the first direction D1).

Each of the signal lines 130 to 135 is connected to a corresponding one of the connection portions 240 to 245 on a one-to-one basis. Then, each of the signal lines 130 to 135 is connected to a corresponding one of comparators 160 to 165 on a one-to-one basis. For example, the signal line 130 is connected to the comparator 160 through the connection portion 240. Further, the signal line 131 is connected to the comparator 161 through the connection portion 241.

Between a single signal line and a single comparator, a corresponding one of switch units 230 to 235 is provided. Then, the comparators 160 to 165 are connected to counters 170 to 175 on a one-to-one basis. In the portion P4, the reading circuit 250 includes the comparators 160 to 165, the switch units 230 to 235, and the counters 170 to 175 corresponding to the signal lines 130 to 135. Signals from the counters 170 to 175 are output through a horizontal scanning circuit 180 and an output circuit 190.

In the configurations of the switch units 230 to 235, similarly to the switch units in FIG. 3, each of the switch units 230 to 235 includes first type, second type, and third type switches. Each of the first type switches of the switch units 230, 232, and 234 includes a first terminal connected to a corresponding one of the signal lines 130, 132, and 134, and a second terminal connected to a corresponding one of the comparators 160, 162, and 164. Each of the second type switches of the switch units 230, 232, and 234 includes a first terminal connected to the corresponding one of the signal lines 130, 132, and 134 (and the first terminal of the first type switch connected to the signal line), and a second terminal connected to a bypass line 325. Each of the third type switches of the switch units 230, 232, and 234 includes a first terminal connected to the corresponding one of the comparators 160, 162, and 164 (and the second terminal of the first type switch connected to the comparator), and a second terminal connected to the bypass line 325. Each of the first type switches of the switch units 231, 233, and 235 includes a first terminal connected to a corresponding one of the signal lines 131, 133, and 135, and a second terminal connected to a corresponding one of the comparators 161, 163, and 165. Each of the second type switches of the switch units 231, 233, and 235 includes a first terminal connected to the corresponding one of the signal lines 131, 133, and 135 (and the first terminal of the first type switch connected to the signal line), and a second terminal connected to a bypass line 326. Each of the third type switches of the switch units 231, 233, and 235 includes a first terminal connected to the corresponding one of the comparators 161, 163, and 165 (and the second terminal of the first type switch connected to the comparator), and a second terminal connected to the bypass line 326. As compared with the above exemplary embodiments, the number of switch units that can be commonly connected to a single bypass line is three. That is, the numbers of signal lines and comparators that can be commonly connected to a single bypass line are three.

Each of the signal lines 330 to 335 is connected to a corresponding one of the connection portions 340 to 345 on a one-to-one basis. Then, the signal lines 330 to 335 are connected to the reading circuit 251 similar to the reading circuit 250. That is, each of the signal lines 330 to 335 is connected to a corresponding one of comparators on a one-to-one basis. For example, the signal line 330 is connected to a single corresponding comparator through the connection portion 340. Further, the signal line 331 is connected to another corresponding comparator through the connection portion 341. To the reading circuit 251, a signal is input from a ramp generator 151 similar to a ramp generator 150. Signals from the reading circuit 251 are also output through a horizontal scanning circuit 181 and an output circuit 191. Also in the reading circuit 251, similarly to the reading circuit 250, six switch units are disposed. Thus, the reading circuit 251 can perform reading operations similar to those of the reading circuit 250. That is, the reading paths are symmetrical in an up-down direction.

In other words, in FIG. 7, the portion P4 includes six reading paths in each of two directions, i.e., a down direction (the direction opposite to the first direction D1) and an up direction (the first direction D1).

Each of the signal lines 130 to 135 and 330 to 335 includes a portion provided on the semiconductor substrate including the pixel region 110, and a portion provided on the semiconductor substrate including the circuit other than the pixel region 110. In other words, these portions of each signal line are connected together by a corresponding one of the connection portions 240 to 245 and 340 to 345.

The 12 pixels PIX are sequentially connected to the signal lines 130, 330, 131, 331, 132, 332, 133, 333, 134, 334, 135, and 335 along the first direction D1. The pixels PIX in odd-numbered rows in FIG. 7 are connected to the signal lines 330 to 335, and the pixels PIX in even-numbered rows are connected to the signal lines 130 to 135. Based on these connections, in a color imaging apparatus, for example, when color filters in the Bayer arrangement are used, signals of pixels corresponding to color filters of the same color can be read in the same direction. As a matter of course, such connections between pixels and signal lines can be appropriately selected according to the purpose.

Further, the signal lines 130, 132, and 134 are connected to the bypass line 325 through the switch units 230, 232, and 234, respectively. The signal lines 131, 133, and 135 are connected to the bypass line 326 through the switch units 231, 233, and 235, respectively. Based on these connections, it is possible to reduce moire in the addition or thinning reading of the same color. Such switch units commonly connected to the bypass lines 325 and 326 and the number of the switch units can also be appropriately changed according to the purpose.

Next, operation modes are described. Also according to the present exemplary embodiment, the imaging apparatus can have first and second operation modes similarly to the other exemplary embodiments. First, in the first operation mode, the switch units 230 to 235 connect the signal lines 130 to 135 to the comparators 160 to 165, respectively. Similarly, the signal lines 330 to 335 are also connected to the respective comparators. Consequently, it is possible to simultaneously perform AD conversion of signals of pixels PIX for 12 rows, i.e., perform parallel processing.

In the second operation mode, the switch units 230, 232, and 234 connect the signal lines 130, 132, and 134 to any one of the comparators such as the comparator 162 in this order. The switch units 231, 233, and 235 connect the signal lines 131, 133, and 135 to any one of the comparators, for example, the comparator 163. The same applies to the signal lines 330 to 335. In this operation, it is possible to simultaneously perform AD conversion of signals of pixels PIX for four rows. Thus, the number of comparators to operate decreases, and therefore, it is possible to reduce the amount of current consumption when the imaging apparatus operates. Additionally, the number of comparators to operate in parallel decreases, and therefore, it is possible to reduce noise due to a fluctuation in a power supply voltage or a change in the output of a comparator.

As a matter of course, the comparator to which the switch units 230, 232, and 234 are connected may be any of the three comparators and can be appropriately selected according to the addition or the thinning of signals to be read. According to the present exemplary embodiment, since the comparators for use in reading are the comparators 162 and 163, it is possible to achieve the symmetry of the layout of the comparators 162 and 163 in the signal paths and bring the influences of noise of the comparators 162 and 163 close to being equal. This is because the comparators 162 and 163 are the same in the position among the comparators commonly connected to each bypass line. Further, FIG. 7 illustrates an example where the two bypass lines 325 and 326 are provided for six signal lines and six switch units. Alternatively, a single bypass line may be provided for six signal lines and six switch units. The correspondence relationships among the numbers of bypass lines, signal lines, and switch units can be optionally set.

FIGS. 8A and 8B are diagrams illustrating the schematic layout of the signal lines, the connection portions, and the comparators in FIG. 7. FIG. 8A illustrates 12 pixels PIX arranged in a single column and 12 rows on a substrate including pixels PIX, signal lines 130 to 135 and 330 to 335, and connection portions 240 to 245 and 340 to 345. FIG. 8B illustrates comparators 160 to 165 and 360 to 365 on a substrate including comparators, switch units 230 to 235 and 350 to 355, connection portions 240 to 245 and 340 to 345, and four bypass lines 325 to 328. Each of the four bypass lines 325 to 328 is commonly connected to any number of (three in this case) switch units. The connection portions 240 to 245 and 340 to 345 in FIGS. 8A and 8B are placed in a laminated manner such that the connection portions 240 to 245 and 340 to 345 in FIG. 8A coincide with the connection portions 240 to 245 and 340 to 345 in FIG. 8B. Each of the connection portions 240 to 245 and 340 to 345 is composed of an electrode and a wiring line connecting the two substrates at its position.

As illustrated in FIG. 8A, the 12 signal lines 130 to 135 and 330 to 335 extend along the direction in which the plurality of pixels PIX connected to the signal lines 130 to 135 and 330 to 335 are arranged, i.e., the first direction D1. In the diagram, to facilitate understanding, the pixels PIX are disposed adjacent to the signal lines 130 to 135 and 330 to 335 in a plan view. Actually, however, the pixels PIX and the signal lines 130 to 135 and 330 to 335 are disposed in a superimposed manner That is, in a plan view, 12 signal lines are disposed for a single pixel column, overlapping the pixel region 110 illustrated in FIG. 7 where the pixels PIX are disposed. The "plan view" is a diagram obtained by projecting the components onto any plane. Examples of any plane include the joint surface between semiconductor substrates, and the surface of a semiconductor substrate. The surface of a semiconductor substrate can be defined by, for example, the light incidence plane of a photoelectric conversion element or the gate insulating film interface of a transistor.

FIG. 8B illustrates the layout of the comparators 160 to 165 and 360 to 365 corresponding to the 12 signal lines 130 to 135 and 330 to 335 illustrated in FIG. 8A. The comparators 160 to 165 and 360 to 365 are commonly connected to a bypass line three by three. Then, the comparators 160 to 165 and 360 to 365 are arranged along the first direction D1. Similarly, the switch units 230 to 235 and 350 to 355 provided corresponding to the comparators 160 to 165 and 360 to 365 are disposed along the first direction D1. Then, at least some of the four bypass lines 325 to 328 are disposed extending along the first direction D1. With such arrangement, the comparators can be placed overlapping the 12 signal lines illustrated in FIG. 8A. Thus, it is possible to reduce the chip area of the imaging apparatus. Further, with such arrangement, it is possible to reduce the distances of the signal paths.

Then, as illustrated in FIGS. 8A and 8B, the connection portions 240 to 245 and 340 to 345 are also disposed corresponding to the comparators 160 to 165 and 360 to 365 along the first direction D1. With such arrangement of the connection portions 240 to 245 and 340 to 345, it is easy to bring the lengths of the signal paths to the comparators 160 to 165 and 360 to 365 close to being equivalent to each other and bring the relative arrangement relationships with other wiring lines close to being equivalent to each other. Although in FIG. 8A, the arrangement distances between the connection portions 240 to 245 and 340 to 345 are different in the first direction D1, it is more desirable that these arrangement distances should be equal. Further, adjacent connection portions among the connection portions 240 to 245 and 340 to 345 are disposed separately (in an offset manner) from each other along the first direction D1 so that the adjacent connection portions are not disposed in a direction along the second direction D2. With such separation, it is possible to make wiring lines and the distance between the wiring lines minute and also secure a process margin for a connection portion composed of a through-silicon via. As described above, with the arrangement of the elements illustrated in FIGS. 8A and 8B, it is possible to maintain the symmetry between the reading paths from pixels and a process margin for forming a connection portion.

The connection portions 240 to 245 and 340 to 345 may be provided outside the pixel region 110 in FIG. 7. Further, a plurality of connection portions may be provided for a single signal line by, for example, providing the connection portions illustrated in FIGS. 8A and 8B inside the pixel region 110 and also providing connection portions outside the pixel region 110. The positions and the number of connection portions can be appropriately changed. Further, according to the present exemplary embodiment, the circuits for the current sources and the ramps are provided on the substrate on which the comparators are disposed, but may be provided on the substrate on which the pixels PIX are disposed. Further, according to the present exemplary embodiment, 12 signal lines are provided over the entirety of a single pixel column, but the number and the arrangement of signal lines according to the present invention are not limited. For example, a configuration in which 12 signal lines having lengths half that of a single pixel column are provided above and below each other may be employed.

Figure 9:
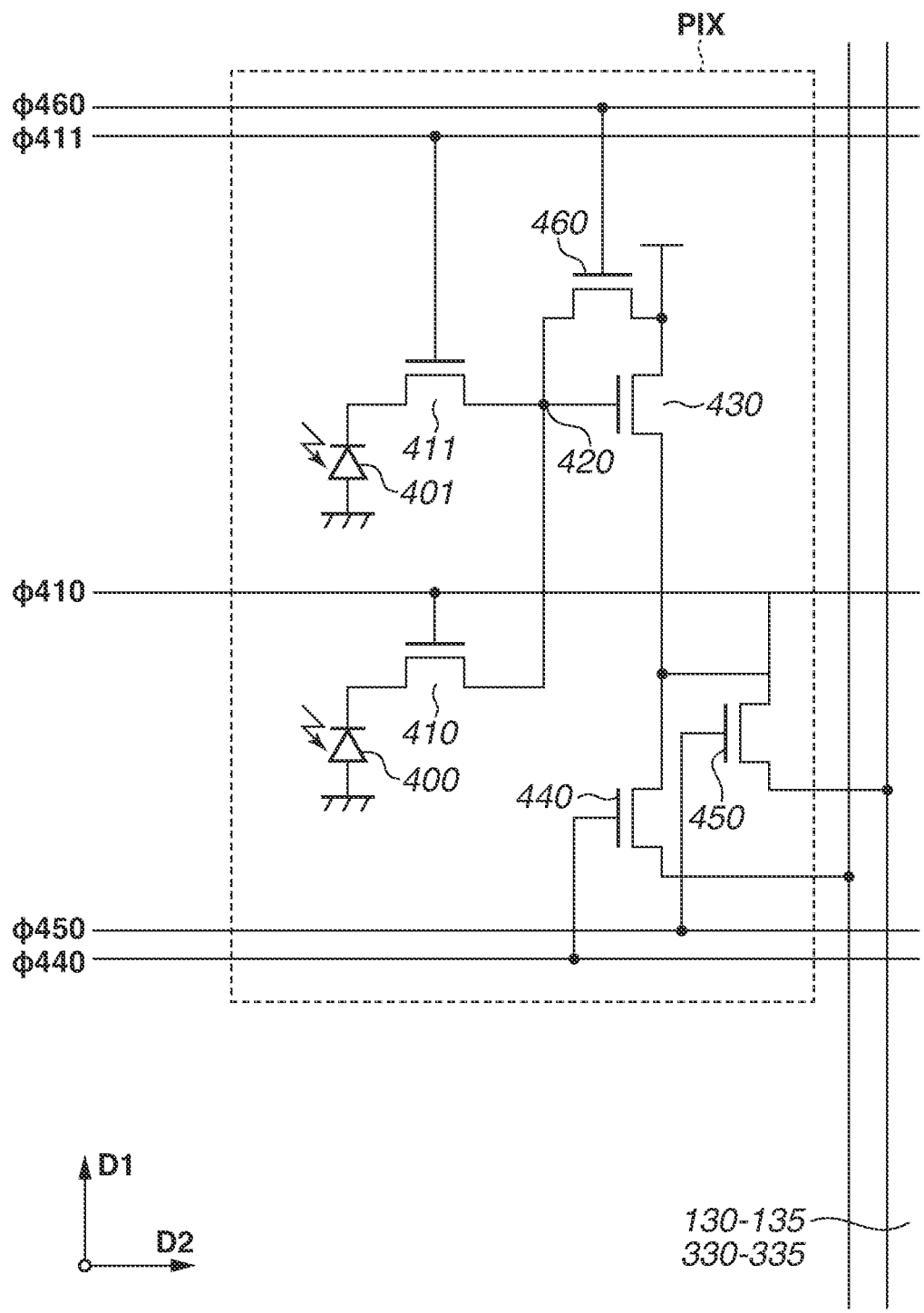
FIG. 9 is a schematic diagram of an imaging apparatus according to a fifth exemplary embodiment.
Figure 10A:
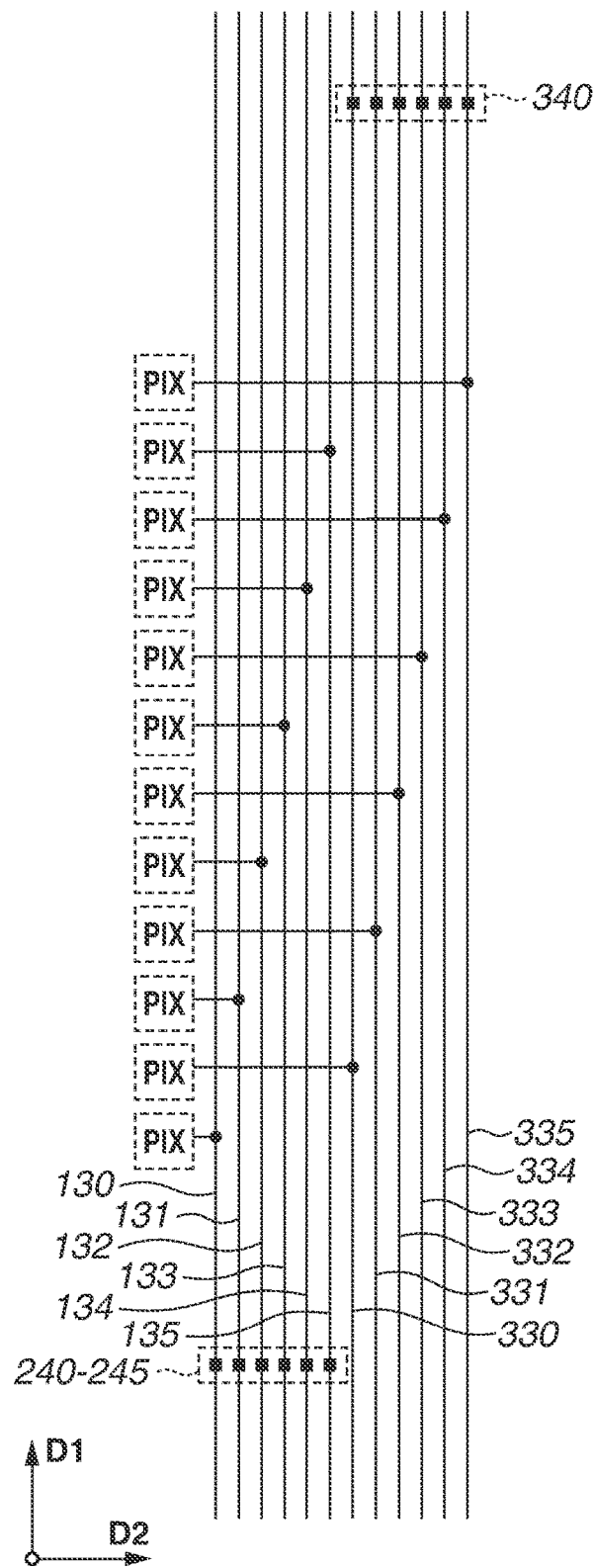
FIGS. 10A and 10B are schematic diagrams of the imaging apparatus according to the fifth exemplary embodiment.
Figure 10B:
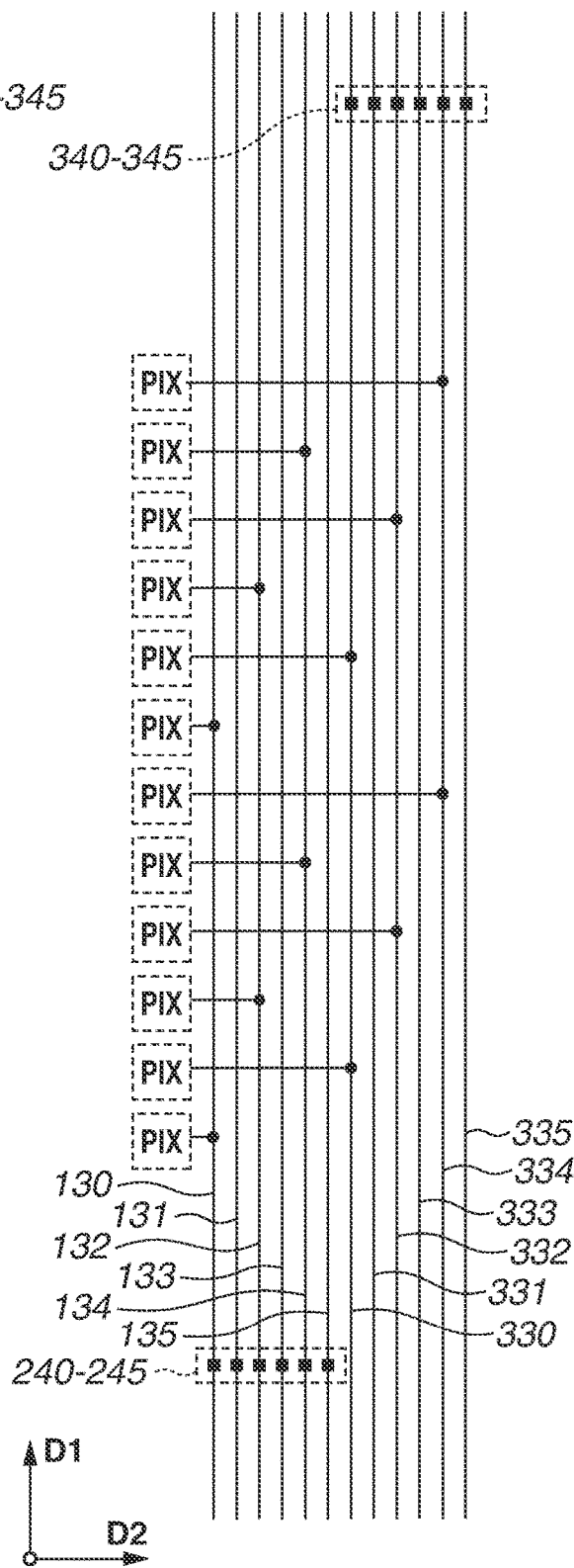

FIGS. 9, 10A, and 10B are schematic diagrams of an imaging apparatus for describing a fifth exemplary embodiment. FIG. 9 is a circuit diagram of a single pixel PIX. In the configuration of the pixel PIX in FIG. 9, as compared with the configurations of the pixels 100 and 101 illustrated in FIG. 4, a single photoelectric conversion element, a single transfer transistor, and a single selection transistor are added. That is, the pixel PIX at least includes two photoelectric conversion elements 400 and 401, two transfer transistors 410 and 411, a single amplification transistor 430, a single reset transistor 460, and two selection transistors 440 and 450. The two transfer transistors 410 and 411 are connected in parallel to an FD region 420, and the two selection transistors 440 and 450 are connected in parallel to the source of the single amplification transistor 430.

Each of the two selection transistors 440 and 450 is connected to one of a plurality of signal lines. The signal lines to which the two selection transistors 440 and 450 are connected may be two different signal lines, or may be the same single signal line. In FIG. 9, the signal lines to which the selection transistors 440 and 450 are connected are any one or two of a plurality of signal lines 130 to 135 and 330 to 335. The specific connection relationships will be described below with reference to FIGS. 10A and 10B.

A single microlens is provided for the single pixel PIX illustrated in FIG. 9. That is, a single microlens is provided for two photoelectric conversion elements. With such a configuration, a signal for performing focus detection can be obtained. As described above, a configuration in which a single microlens is provided over a plurality of pixels PIX including the pixel PIX in FIG. 9 and a pixel PIX adjacent to the pixel PIX may be employed.

FIGS. 10A and 10B are diagrams illustrating the connections between pixels PIX and signal lines 130 to 135 and 330 to 335. FIG. 10A is a diagram illustrating the connections between the selection transistors 440 of the pixels PIX and the signal lines 130 to 135 and 330 to 335. FIG. 10B is a diagram illustrating the connections between the selection transistors 450 of the pixels PIX and the signal lines 130 to 135 and 330 to 335. Although FIGS. 10A and 10B illustrate 12 pixels PIX, actually, the 12 pixels PIX are repeatedly placed along the first direction D1. The connections in FIG. 10A are similar to those in the example illustrated in FIG. 7. Thus, similarly to the fourth exemplary embodiment, the imaging apparatus according to the present exemplary embodiment has a first operation mode where signals of pixels PIX in 12 rows can be read in parallel, and a second operation mode where signals of pixels PIX in four rows can be read in parallel. The second operation mode also includes the operation of adding signals of pixels PIX in a plurality of rows and reading the added signals as signals for four rows.

Then, the imaging apparatus has an operation mode where signals of pixels PIX in six rows can be read in parallel using the selection transistors 450 illustrated in FIG. 10B. In FIG. 10B, signals of pixels PIX for six rows can be simultaneously read into the signal lines 130, 132, 134, 330, 332, and 334. Consequently, the signals can be subjected to AD conversion in parallel using comparators 160, 162, 164, 360, 362, and 364. Also this operation mode includes the operation of adding signals of pixels PIX in a plurality of rows and reading the added signals as signals for six rows. Taking into account the addition or the thinning of signals of pixels PIX, it can be determined which of the signal lines the selection transistors 450 are to be connected. These connections are not limited to a form according to the present exemplary embodiment.

The arrangement of connection portions 240 to 245 and 340 to 345 illustrated in FIGS. 10A and 10B can be similar to that in FIG. 8A.

Figure 11:
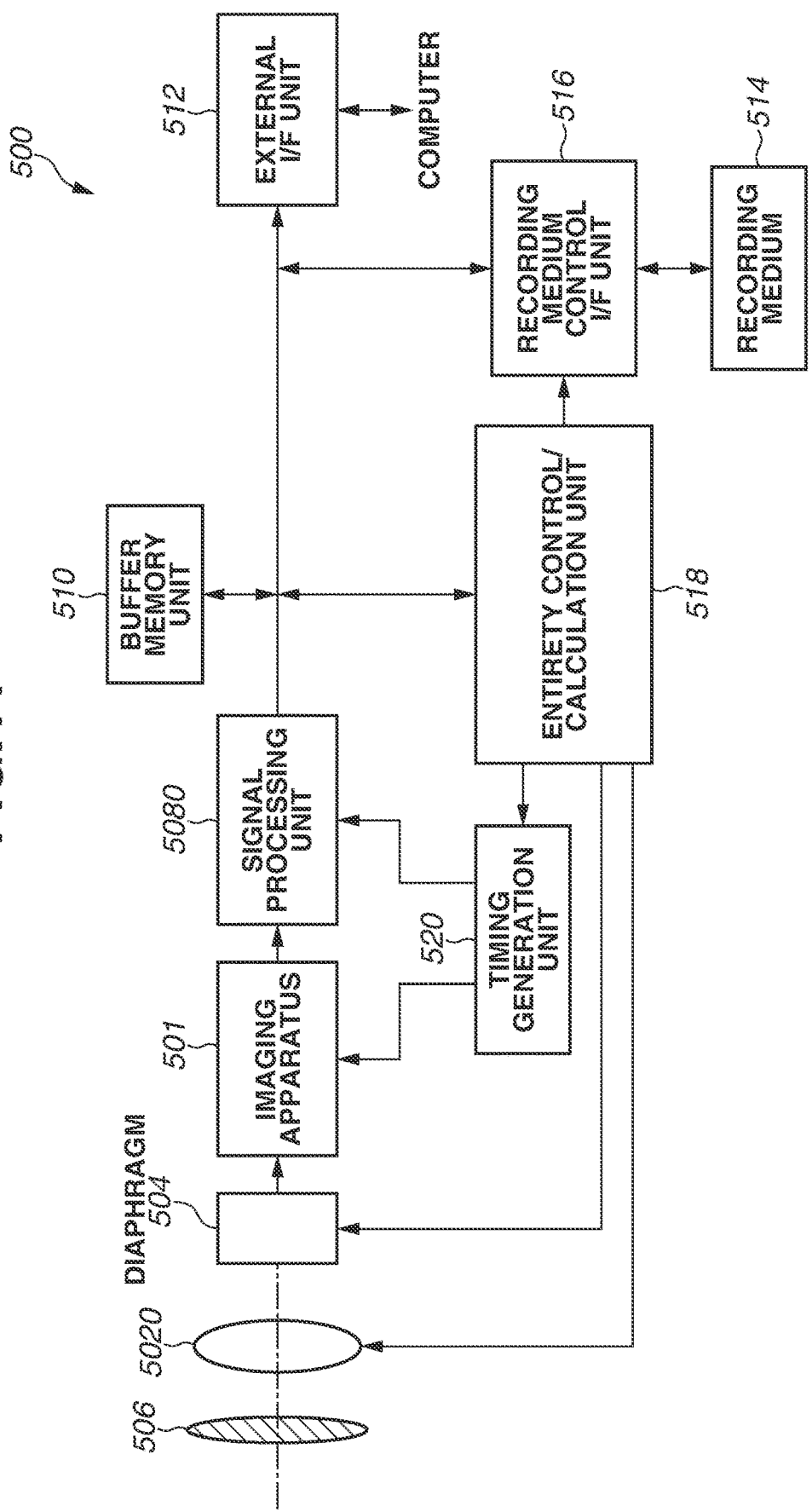
FIG. 11 is a diagram illustrating a configuration of an imaging system according to a sixth exemplary embodiment.

FIG. 11 is a block diagram illustrating the configuration of an imaging system 500 according to a sixth exemplary embodiment. The imaging system 500 according to the present exemplary embodiment includes an imaging apparatus 501 to which any of the imaging apparatuses described in the above exemplary embodiments is applied. Specific examples of the imaging system 500 include a digital still camera, a digital camcorder, and a monitoring camera. FIG. 11 illustrates a digital still camera as an example of the imaging system 500.

The imaging system 500 illustrated in FIG. 11 includes the imaging apparatus 501, a lens 5020 that forms an optical image of an object on the imaging apparatus 501, a diaphragm 504 that makes the amount of light passing through the lens 5020 variable, and a barrier 506 that protects the lens 5020. The lens 5020 and the diaphragm 504 are an optical system for collecting light on the imaging apparatus 501.

The imaging system 500 further includes a signal processing unit 5080 that processes an output signal output from the imaging apparatus 501. The signal processing unit 5080 performs a signal processing operation for performing various types of correction and compression on an input signal as necessary and outputting the resulting signal. The imaging system 500 further includes a buffer memory unit 510 that temporarily stores image data, and an external interface unit (external I/F unit) 512 that is used to communicate with an external computer. Further, the imaging system 500 includes a recording medium 514, such as a semiconductor memory in or from which captured data is recorded or read, a recording medium control interface unit (recording medium control I/F unit) 516 that is used to record or read captured data in or from the recording medium 514. The recording medium 514 may be built into the imaging system 500, or may be attachable to and detachable from the imaging system 500. Further, the imaging system 500 may wirelessly communicate with the recording medium 514 via the recording medium control I/F unit 516, or may wirelessly communicate via the external I/F unit 512.

Further, the imaging system 500 includes an entirety control/calculation unit 518 that performs various calculations and also controls the entirety of the digital still camera, and a timing generation unit 520 that outputs various timing signals to the imaging apparatus 501 and the signal processing unit 5080. The timing signals may be input from outside, and the imaging system 500 only needs to include at least the imaging apparatus 501 and the signal processing unit 5080 that processes an output signal output from the imaging apparatus 501. The entirety control/calculation unit 518 and the timing generation unit 520 may be configured to perform a part or all of the control function of the imaging apparatus 501.

The imaging apparatus 501 outputs an image signal to the signal processing unit 5080. The signal processing unit 5080 performs predetermined signal processing on the image signal output from the imaging apparatus 501 and outputs image data. Further, the signal processing unit 5080 generates an image using the image signal. The signal processing unit 5080 and the timing generation unit 520 may be provided on the substrate on which the comparators of the imaging apparatus according to the present exemplary embodiment are provided. Alternatively, a configuration in which the signal processing unit 5080 and the timing generation unit 520 are provided on another substrate may be employed. With the configuration of an imaging system configured using the imaging apparatus according to each of the above exemplary embodiments, it is possible to achieve an imaging system capable of acquiring an image with better quality.

Figure 12A:
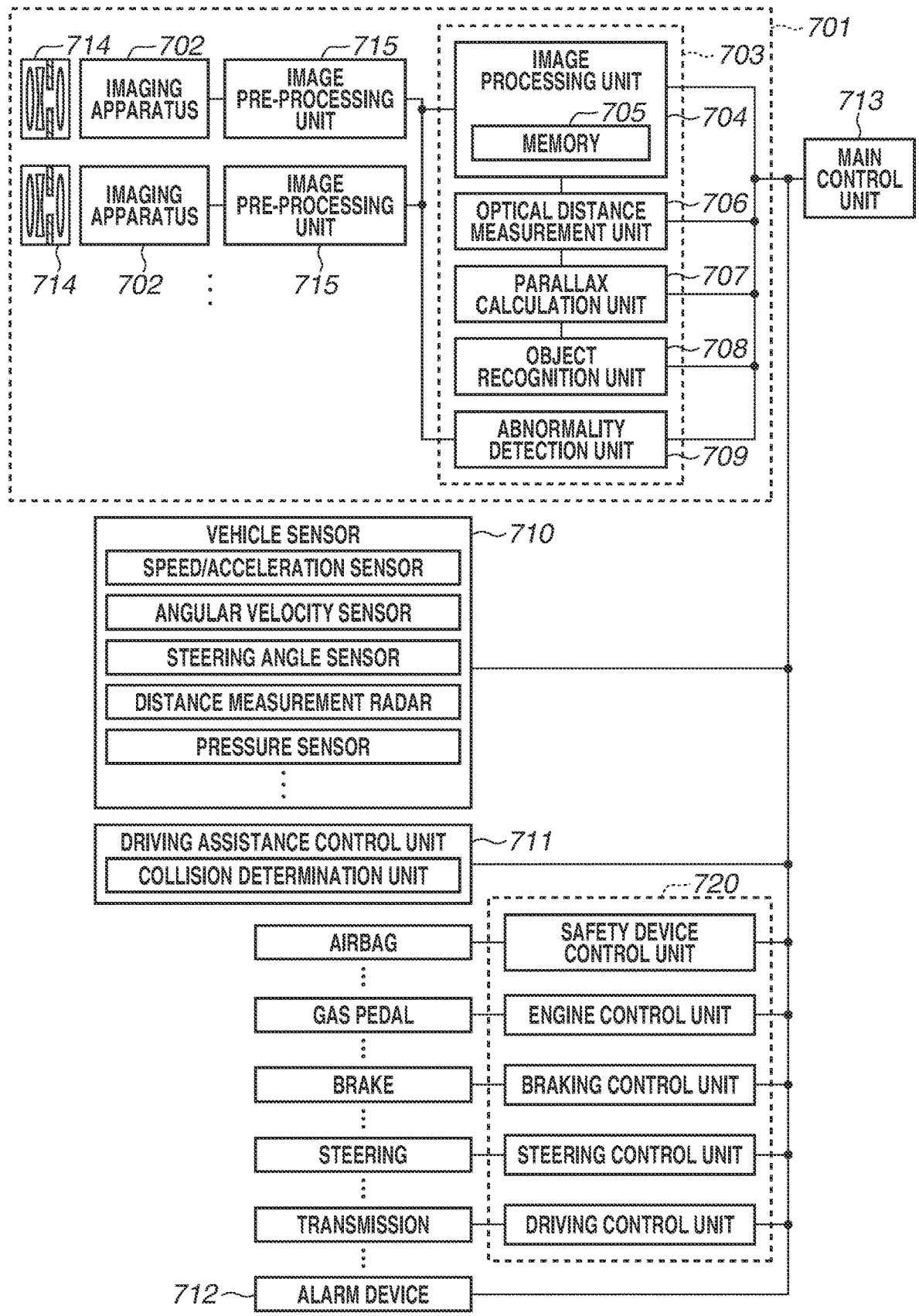
FIG. 12A is a diagram illustrating a configuration of a moving body according to a seventh exemplary embodiment.

With reference to FIGS. 12A, 12B, and 13, an imaging system and a moving body according to a seventh exemplary embodiment are described. FIGS. 12A and 12B are schematic diagrams illustrating examples of the configurations of the imaging system and the moving body according to the present exemplary embodiment. FIG. 13 is a flowchart illustrating the operation of the imaging system according to the present exemplary embodiment. According to the present exemplary embodiment, an in-vehicle camera is illustrated as an example of the imaging system.

FIGS. 12A and 12B illustrate examples of a vehicle system and an imaging system mounted on the vehicle system. An imaging system 701 includes an imaging apparatus 702, an image pre-processing unit 715, an integrated circuit 703, and an optical system 714. The optical system 714 forms an optical image of an object on the imaging apparatus 702. The imaging apparatus 702 converts the optical image of the object formed by the optical system 714 into an electric signal. The imaging apparatus 702 is the imaging apparatus according to any of the above exemplary embodiments. The image pre-processing unit 715 performs predetermined signal processing on the signal output from the imaging apparatus 702. The function of the image pre-processing unit 715 may be built into the imaging apparatus 702. In the imaging system 701, at least two sets of the optical system 714, the imaging apparatus 702, and the image pre-processing unit 715 are provided so that outputs from the image pre-processing units 715 in the respective sets are input to the integrated circuit 703.

The integrated circuit 703 is an integrated circuit for an imaging system and includes an image processing unit 704 that includes a memory 705, an optical distance measurement unit 706, a parallax calculation unit 707, an object recognition unit 708, and an abnormality detection unit 709. The image processing unit 704 performs a development process or image processing, such as defect correction on an output signal from each image pre-processing unit 715. The memory 705 primarily stores a captured image or stores the position of a defect of an imaging pixel. The optical distance measurement unit 706 focuses on an object or measures the distance from the object. The parallax calculation unit 707 calculates a parallax (the phase difference between parallax images) from a plurality of pieces of image data acquired by the plurality of imaging apparatuses 702. The object recognition unit 708 recognizes an object, such as a vehicle, a road, a sign, or a person. If detecting an abnormality in the imaging apparatuses 702, the abnormality detection unit 709 informs a main control unit 713 of the abnormality.

The integrated circuit 703 may be achieved by hardware designed exclusively for the integrated circuit 703, or achieved by a software module, or achieved by the combination of these. Alternatively, the integrated circuit 703 may be achieved by a field-programmable gate array (FPGA) or an application-specific integrated circuit (ASIC), or achieved by the combination of these.

The main control unit 713 performs overall control of the operations of the imaging system 701, a vehicle sensor 710, and a control unit 720. It is also possible to employ a method in which the main control unit 713 is not included, and the imaging system 701, the vehicle sensor 710, and the control unit 720 individually include communication interfaces, and each transmit and receive a control signal through a communication network (e.g., the Controller Area Network (CAN) standard).

The integrated circuit 703 has the function of transmitting a control signal and a setting value to each imaging apparatus 702 by receiving a control signal from the main control unit 713 or by a control unit of the integrated circuit 703. For example, the integrated circuit 703 transmits a setting for driving a voltage switch 13 in the imaging apparatus 702 in a pulsed manner, or a setting for switching the voltage switch 13 in each frame.

The imaging system 701 is connected to the vehicle sensor 710 and can detect the running states, such as the speed, the yaw rate, and the steering angle, of a vehicle in which the imaging system 701 is provided, the environment outside the vehicle, and the states of another vehicle and an obstacle. The vehicle sensor 710 is also a distance information acquisition unit for acquiring, from parallax images, distance information regarding the distance from a target object. Further, the imaging system 701 is connected to a driving assistance control unit 711 that performs various types of driving assistance, such as automatic steering, automatic cruising, and a collision prevention function. Particularly, regarding a collision determination function, based on the detection result of the imaging system 701 and the vehicle sensor 710, a collision determination unit estimates collision with another vehicle or an obstacle and determines the presence or absence of collision with another vehicle or an obstacle. Consequently, in a case where collision is estimated, avoidance control is performed. Further, when collision occurs, a safety device is started.

Further, the imaging system 701 is also connected to an alarm device 712 that gives an alarm to a driver based on the determination result of the collision determination unit. For example, as the determination result of the collision determination unit, if there is a high possibility of collision, the main control unit 713 applies a brake, returns the gas pedal, or suppresses the engine output, to control the vehicle to avoid collision and reduce damage. The alarm device 712 warns a user by setting off an alarm such as a sound, displaying alarm information on a screen of a display unit of an automotive navigation system or a meter panel, or imparting a vibration to the seat belt or the steering.

According to the present exemplary embodiment, the imaging system 701 captures the periphery, such as the front direction or the rear direction, of the vehicle. FIG. 12B illustrates an example of the arrangement of the imaging system 701 in a case where the imaging system 701 captures the front direction of the vehicle.

The two imaging apparatuses 702 are placed in a front portion of a vehicle 700. Specifically, a center line with respect to the movement direction or the outer shape (e.g., the width) of the vehicle 700 is set as a symmetrical axis, and the two imaging apparatuses 702 are placed line-symmetrically with respect to the symmetrical axis. This is desirable for acquiring distance information regarding the distance between the vehicle 700 and an image capturing target object and determining the possibility of collision. Further, it is desirable to place the imaging apparatuses 702 in such a manner that the driver's view is not obstructed by the imaging apparatuses 702 when the driver visually confirms the situation outside the vehicle 700 from the driver's seat. It is desirable to place the alarm device 712 so that the alarm device 712 easily comes within the driver's view.

Next, with reference to FIG. 13, a failure detection operation for each imaging apparatus 702 in the imaging system 701 is described. The failure detection operation regarding the imaging apparatus 702 is performed according to steps S810 to S880 illustrated in FIG. 13.

In step S810, settings for starting up the imaging apparatus 702 are performed. That is, settings for the operation of the imaging apparatus 702 are transmitted from outside the imaging system 701 (e.g., the main control unit 713) or inside the imaging system 701, and an image capturing operation and a failure detection operation regarding the imaging apparatus 702 are started.

Next, in step S820, a pixel signal is acquired from an effective pixel. Further, in step S830, an output value from a failure detection pixel provided for failure detection is acquired. Similarly to the effective pixel, the failure detection pixel includes a photoelectric conversion unit. A predetermined voltage is written to the photoelectric conversion unit. The failure detection pixel outputs a signal corresponding to the voltage written in the photoelectric conversion unit. Steps S820 and S830 may be reversed.

Next, in step S840, it is determined whether an output expectation value of the failure detection pixel coincides with an actual output value of the failure detection pixel. As a result of the determination in step S840, if the output expectation value and the actual output value coincide with each other (YES in step S840), the processing proceeds to step S850. In step S850, it is determined that the image capturing operation is normally performed. Then, the processing proceeds to step S860. In step S860, the pixel signal in a scan row is transmitted to and primarily saved in the memory 705. Then, the processing returns to step S820. In step S820, the failure detection operation is continued. Meanwhile, as a result of the determination in step S840, if the output expectation value and the actual output value do not coincide with each other (NO in step S840), the processing proceeds to step S870. In step S870, it is determined that there is an abnormality in the image capturing operation. Then, an alarm is given to the main control unit 713 or the alarm device 712. The alarm device 712 performs, on the display unit, display indicating that an abnormality is detected. Then, in step S880, the imaging apparatus 702 is stopped, and the operation of the imaging system 701 is ended.

According to the present exemplary embodiment, an example has been illustrated where the flowchart loops for each row. Alternatively, the flowchart may loop for a plurality of rows, or the failure detection operation may be performed for each frame. When an alarm is given in step S870, the vehicle 700 may notify externally of information through a wireless network.

Further, according to the present exemplary embodiment, a description has been given of control for preventing a vehicle from colliding with another vehicle. Alternatively, the present exemplary embodiment is also applicable to control for automatically driving a vehicle by following another vehicle, or control for automatically driving a vehicle so as to stay in a lane. Further, the imaging system 701 can be applied not only to a vehicle, such as an automobile, but also to a moving body (a moving apparatus) such as a vessel, an aircraft, or an industrial robot. Additionally, the imaging system 701 can be applied not only to a moving body but also to a device widely using object recognition, such as an intelligent transportation system (ITS).

The present invention is not limited to the above exemplary embodiments, but can be modified in various manners. For example, an example where some of the components in any of the exemplary embodiments are added to another exemplary embodiment, and an example where some of the components in any of the exemplary embodiments are replaced with some of the components in another exemplary embodiment are also exemplary embodiments of the present invention. Further, in the diagrams illustrating each exemplary embodiment, the connection between elements has a direct connection relationship in the illustration, but can be appropriately changed by inserting another element, such as a switch, a buffer, between the elements. Further, all the above exemplary embodiments of the present invention merely illustrate specific examples for carrying out the present invention, and the technical scope of the present invention should not be interpreted in a limited manner based on these examples. That is, the present invention can be carried out in various forms without departing from the technical idea or the main feature of the present invention.

While the present invention has been described with reference to exemplary embodiments, it is to be understood that the invention is not limited to the disclosed exemplary embodiments.

This application claims the benefit of Japanese Patent Application No. 2018-110421, filed Jun. 8, 2018, which is hereby incorporated by reference herein in its entirety.

What is claimed is:

1. An imaging apparatus comprising:
a plurality of pixels including a first pixel and a second pixel;
a plurality of signal lines including a first signal line connected to the first pixel and a second signal line connected to the second pixel;
a plurality of comparators including a first comparator and a second comparator, the first comparator being configured to receive signal from the first signal line, the second comparator being configured to receive signal from the first signal line and the second signal line;
a first switch including a first terminal and a second terminal, wherein the first terminal of the first switch is connected to the second signal line and configured to receive the signal from the second signal line, and the second terminal of the first switch is connected to an input node of the second comparator;
a second switch including a first terminal and a second terminal, wherein the second terminal of the second switch is connected to the first signal line and configured to receive the signal from the first signal line as an input, and the first terminal of the second switch is connected to the input node of the second comparator; and
a third switch including a first terminal and a second terminal, wherein the first terminal of the third switch is connected to the first signal line and configured to receive the signal from the first signal line, and the second terminal of the third switch is connected to the second terminal of the second switch.

2. The imaging apparatus according to claim 1, further comprising a fourth switch including a first terminal and a second terminal, wherein the first terminal of the fourth switch is connected to the first signal line and configured to receive the signal from the first signal line, and the second terminal of the fourth switch is connected to an input node of the first comparator.

3. The imaging apparatus according to claim 2, further comprising:
a fifth switch including a first terminal and a second terminal, wherein the first terminal of the fifth switch is connected to an input node of the first comparator, and the second terminal of the fifth switch is connected to the second terminal of the second switch; and
a sixth switch including a first terminal and a second terminal, wherein the first terminal of the sixth switch is connected to the second signal line and configured to receive the signal from the second signal line, and the second terminal of the sixth switch is connected to the second terminal of the second switch.

4. The imaging apparatus according to claim 1, wherein the imaging apparatus has:
a first operation mode of performing an operation for inputting a signal from the first pixel to the first comparator and an operation for inputting a signal from the second pixel to the second comparator, in a state where the first switch is ON and the second switch is OFF; and
a second operation mode of performing an operation for inputting a signal from the first pixel to the second comparator, in a state where the first switch is OFF and the second switch is ON, and performing an operation for inputting a signal from the second pixel to the second comparator, in a state where the first switch is ON and the second switch is OFF.

5. The imaging apparatus according to claim 1, wherein the imaging apparatus has a third operation mode of performing an operation for inputting a signal from the first pixel to both the first comparator and the second comparator, in a state where the first switch is OFF and the second switch is ON.

6. An imaging system comprising:
the imaging apparatus according to claim 1; and
a signal processing unit configured to process a signal output from the imaging apparatus.

7. A moving body comprising:
the imaging apparatus according to claim 1;
a distance information acquisition unit configured to acquire, from a parallax image based on a signal from the imaging apparatus, distance information about a distance to a target object; and
a control unit configured to control the moving body based on the distance information.

8. An imaging apparatus comprising:
a plurality of pixels;
a plurality of signal lines, each of the plurality of signal lines being connected to at least a different one of the plurality of pixels;

a plurality of comparators provided in such a manner the plurality of comparators corresponds to the plurality of signal lines;

a plurality of switch units, each of the plurality of switch units being connected to one of the plurality of signal lines and one of the plurality of comparators corresponding to the one signal line; and a bypass line to which at least two of the plurality of switch units are commonly connected, wherein each of the at least two switch units includes:

a first type switch including a first terminal connected to the one signal line and a second terminal connected to the one comparator;

a second type switch including a first terminal and a second terminal, the first terminal being connected to the one signal line and the first terminal of the first type switch, the second terminal being connected to the bypass line; and a third type switch including a first terminal and a second terminal, the first terminal being connected to the one comparator and the second terminal of the first type switch, the second terminal being connected to the bypass line.

9. The imaging apparatus according to claim 8, wherein each of the plurality of pixels includes at least two photoelectric conversion elements, and
wherein a single microlens is arranged for each of the plurality of pixels.

10. The imaging apparatus according to claim 8,
wherein each of the plurality of pixels includes at least one photoelectric conversion element, and
wherein a single microlens is arranged over two pixels adjacent to each other among the plurality of pixels.

11. The imaging apparatus according to claim 8, wherein each of the plurality of pixels includes a first selection transistor and a second selection transistor, the first selection transistor being connected to one of the plurality of signal lines, the second selection transistor being connected to one of the plurality of signal lines.

12. The imaging apparatus according to claim 8,
wherein the plurality of pixels is provided on a first substrate,
wherein the plurality of comparators is provided on a second substrate different from the first substrate, and
wherein in a plan view of a surface of the first substrate, at least some of the plurality of comparators overlap at least some of the plurality of pixels.

13. The imaging apparatus according to claim 12, wherein the plurality of switch units is provided on the second substrate.

14. The imaging apparatus according to claim 12,
wherein the plurality of pixels is arranged in a column at least along a first direction,
wherein the plurality of comparators is arranged in a column along the first direction, and
wherein each of the plurality of signal lines at least includes a portion extending in the first direction.

15. The imaging apparatus according to claim 14, wherein the bypass line at least includes a portion extending in the first direction.

16. The imaging apparatus according to claim 15,
wherein each of the plurality of signal lines includes a first portion provided on the first substrate, a second portion provided on the second substrate, and a connection portion connecting the first portion and the second portion, and wherein the connection portion of one of the plurality of signal lines is arranged separately from the connection portion of another one of the plurality of signal lines in the first direction.

17. The imaging apparatus according to claim 8,
wherein each of the plurality of switch units is configured to have:
a first state for inputting a signal of the one signal line to the one comparator corresponding to the one signal line;
a second state for outputting a signal of the one signal line to the bypass line;
a third state for outputting a signal of the one signal line to both the one comparator corresponding to the one signal line and the bypass line; and
a fourth state for inputting a signal of the bypass line to the one comparator corresponding to the one signal line,
wherein in the first state, the first type switch is ON and the second type switch and third type switch are OFF,
wherein in the second state, the second type switch is ON and the first type switch and third type switch are OFF,
wherein in the third state, at least the first type switch and second type switch are ON, and
wherein in the fourth state, the third type switch is ON and the first type switch and second type switch are OFF.

18. The imaging apparatus according to claim 17,
wherein the plurality of pixels at least includes a first pixel and a second pixel,
wherein the plurality of signal lines at least includes a first signal line connected to the first pixel and a second signal line connected to the second pixel,
wherein the plurality of comparators at least includes a first comparator and a second comparator, the first comparator being provided corresponding to the first signal line, the second comparator being provided corresponding to the second signal line,
wherein the plurality of switch units at least includes a first switch unit and a second switch unit, the first switch unit being connected between the first signal line and the first comparator, the second switch unit being connected between the second signal line and the second comparator, and
wherein the bypass line is commonly connected to at least the first switch unit and the second switch unit.

19. The imaging apparatus according to claim 18, wherein the imaging apparatus has a first operation mode of performing an operation for inputting a signal from the first signal line to the first comparator and an operation for inputting a signal from the second signal line to the second comparator, in a period when each of the first switch and the second switch units is in the first state.

20. The imaging apparatus according to claim 18, wherein the imaging apparatus has a second operation mode of performing an operation for inputting a signal from the first signal line to the second comparator in a period when the first switch unit is in the second state and the second switch unit is in the fourth state, and performing an operation for inputting a signal from the second signal line to the second comparator in a period when the second switch unit is in the first state.

21. The imaging apparatus according to claim 18, wherein the imaging apparatus has a third operation mode of performing an operation for inputting a signal from the first signal line to both the first and second comparators in a period when the first switch unit is in the third state and the second switch unit is in the fourth state.

22. The imaging apparatus according to claim 8,
wherein the plurality of pixels at least includes a first pixel, a second pixel, and a third pixel,
wherein the plurality of signal lines at least includes a first signal line connected to the first pixel, a second signal line connected to the second pixel, and a third signal line connected to the third pixel,
wherein the plurality of comparators at least includes a first comparator, a second comparator, and a third comparator, the first comparator being provided corresponding to the first signal line, the second comparator being provided corresponding to the second signal line, the third comparator being provided corresponding to the third signal line,
wherein the plurality of switch units includes a first switch unit connected between the first signal line and the first comparator, a second switch unit connected between the second signal line and the second comparator, and a third switch unit connected between the third signal line and the third comparator, and
wherein the bypass line is commonly connected to at least the first switch unit, the second switch unit, and the third switch unit.

23. The imaging apparatus according to claim 22,
wherein the imaging apparatus has a first operation mode of:
in the first switch unit, the second switch unit, and third switch units, turning ON the first type switches and turning OFF the second type switches and the third type switches; and
inputting a signal from the first signal line to the first comparator, inputting a signal from the second signal line to the second comparator, and inputting a signal from the third signal line to the third comparator.

24. The imaging apparatus according to claim 22, wherein the imaging apparatus has a second operation mode of:
in the first switch unit and the second switch unit, turning OFF the first type switches and the third type switches;
in the third switch unit, turning OFF the first type switch and turning ON the third type switch; and
sequentially turning ON the second type switches of the first switch unit, the second switch unit, and the third switch unit,
for sequentially inputting a signal from the first signal line, a signal from the second signal line, and a signal from the third signal line to the third comparator.

25. The imaging apparatus according to claim 22,
wherein the imaging apparatus has a third operation mode of:
in the first switch unit, turning ON the first type switch and the second type switch and turning OFF the third type switch;
in the second switch unit, turning OFF the first type switch and the second type switch and turning ON the third type switch; and
in the third switch unit, turning OFF at least the first type switch and the second type switch,
for inputting a signal from the first signal line to the first comparator and inputting the signal from the first signal line to the second comparator.

26. A semiconductor substrate for lamination comprising:
a plurality of connection portions each configured to be connected to a different one of a plurality of signal lines configured to transmit signals based on charges generated by photoelectric conversion;
a plurality of comparators provided corresponding to the plurality of connection portions;
a plurality of switch units each configured to be connected to one of the plurality of connection portions and one of the plurality of comparators corresponding to the one of the plurality of connection portions; and
a bypass line to which at least two of the plurality of switch units are commonly connected,
wherein each of the at least two switch units includes:
a first type switch including a first terminal connected to the one of the plurality of connection portions and a second terminal connected to the one of the plurality of comparators;
a second type switch including a first terminal and a second terminal, the first terminal being connected to the one of the plurality of connection portions and the first terminal of the first type switch, the second terminal being connected to the bypass line; and
a third type switch including a first terminal and a second terminal, the first terminal being connected to the one of the plurality of comparators and the second terminal of the first type switch, the second terminal being connected to the bypass line.

27. The semiconductor substrate for lamination according to claim 26,
wherein each of the at least two switch units is configured to enter:
a first state for inputting a signal of the one of the plurality of connection portions to the one of the plurality of comparators corresponding to the one of the plurality of connection portions;
a second state for outputting a signal of the one of the plurality of connection portions to the bypass line;
a third state for outputting a signal of the one of the plurality of connection portions to both the one of the plurality of comparators corresponding to the one of the plurality of connection portions and the bypass line; and
a fourth state for inputting a signal of the bypass line to the one of the plurality of comparators corresponding to the one of the plurality of connection portions,
wherein in the first state, the first type switch is ON, and the second type switch and the third type switch are OFF,
wherein in the second state, the second type switch is ON, and the first type switch and the third type switch are OFF,
wherein in the third state, at least the first type switch and the second type switch are ON, and
wherein in the fourth state, the third type switch is ON, and the first type and second type switches are OFF.

* * * * *